United States Patent
Tsai

(10) Patent No.: US 10,672,820 B2
(45) Date of Patent: Jun. 2, 2020

(54) HYBRID BONDED STRUCTURE

(71) Applicant: Taiwan Semiconductor Manufacturing Co., Ltd., Hsinchu (TW)

(72) Inventor: Bo-Tsung Tsai, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/983,104

(22) Filed: May 18, 2018

(65) Prior Publication Data

US 2019/0157333 A1 May 23, 2019

Related U.S. Application Data

(60) Provisional application No. 62/590,345, filed on Nov. 23, 2017.

(51) Int. Cl.
*H01L 27/146* (2006.01)
*H01L 23/528* (2006.01)
(Continued)

(52) U.S. Cl.
CPC ........ *H01L 27/14634* (2013.01); *H01L 21/78* (2013.01); *H01L 23/528* (2013.01); *H01L 23/5226* (2013.01); *H01L 24/08* (2013.01); *H01L 24/89* (2013.01); *H01L 24/94* (2013.01); *H01L 25/50* (2013.01);
(Continued)

(58) Field of Classification Search
USPC ........................................ 257/459
See application file for complete search history.

(56) References Cited

U.S. PATENT DOCUMENTS 9,666,573 B1 * 5/2017 Sukekawa ............... H01L 25/50
2012/0217374 A1   8/2012 Nishizawa
(Continued)

FOREIGN PATENT DOCUMENTS

JP   2012178496    9/2012
KR  20130136900   12/2013
(Continued)

OTHER PUBLICATIONS

"Office Action of Taiwan Counterpart Application", dated Jan. 24, 2019, p. 1-p. 6.
(Continued)

*Primary Examiner* — Fazli Erdem
(74) *Attorney, Agent, or Firm* — JCIPRNET

(57) ABSTRACT

A hybrid bonded structure including a first integrated circuit component and a second integrated circuit component is provided. The first integrated circuit component includes a first dielectric layer, first conductors and isolation structures. The first conductors and the isolation structures are embedded in the first dielectric layer. The isolation structures are electrically insulated from the first conductors and surround the first conductors. The second integrated circuit component includes a second dielectric layer and second conductors. The second conductors are embedded in the second dielectric layer. The first dielectric layer is bonded to the second dielectric layer and the first conductors are bonded to the second conductors.

20 Claims, 21 Drawing Sheets

(51) Int. Cl.
*H01L 23/00* (2006.01)
*H01L 21/78* (2006.01)
*H01L 23/522* (2006.01)
*H01L 25/00* (2006.01)
*H01L 23/532* (2006.01)

(52) U.S. Cl.
CPC ...... *H01L 27/1464* (2013.01); *H01L 27/1469* (2013.01); *H01L 27/14603* (2013.01); *H01L 27/14632* (2013.01); *H01L 27/14636* (2013.01); *H01L 27/14687* (2013.01); *H01L 23/53228* (2013.01); *H01L 27/14621* (2013.01); *H01L 27/14623* (2013.01); *H01L 27/14627* (2013.01); *H01L 2224/05647* (2013.01); *H01L 2224/08145* (2013.01); *H01L 2224/08146* (2013.01); *H01L 2224/80011* (2013.01); *H01L 2224/8012* (2013.01); *H01L 2224/80895* (2013.01); *H01L 2224/80896* (2013.01); *H01L 2924/1431* (2013.01); *H01L 2924/2011* (2013.01); *H01L 2924/20104* (2013.01); *H01L 2924/20105* (2013.01); *H01L 2924/20108* (2013.01); *H01L 2924/20109* (2013.01)

(56) References Cited

U.S. PATENT DOCUMENTS

| | | |
|---|---|---|
| 2013/0320556 A1 | 12/2013 | Liu et al. |
| 2014/0015084 A1 | 1/2014 | Chen et al. |
| 2015/0091124 A1* | 4/2015 | Liu .................... H01L 27/1464 257/459 |
| 2015/0108644 A1 | 4/2015 | Kuang et al. |
| 2016/0155665 A1* | 6/2016 | Kuang .................... H01L 24/06 438/109 |
| 2018/0138223 A1 | 5/2018 | Kotoo et al. |
| 2019/0131255 A1* | 5/2019 | Teng .................... H01L 23/585 |

FOREIGN PATENT DOCUMENTS

| | | |
|---|---|---|
| KR | 20140008983 | 1/2014 |
| TW | 201344892 | 11/2013 |
| WO | 2016185883 | 11/2016 |

OTHER PUBLICATIONS

"Office Action of Korea Counterpart Application", dated Feb. 26, 2020, p. 1-p. 8.

* cited by examiner

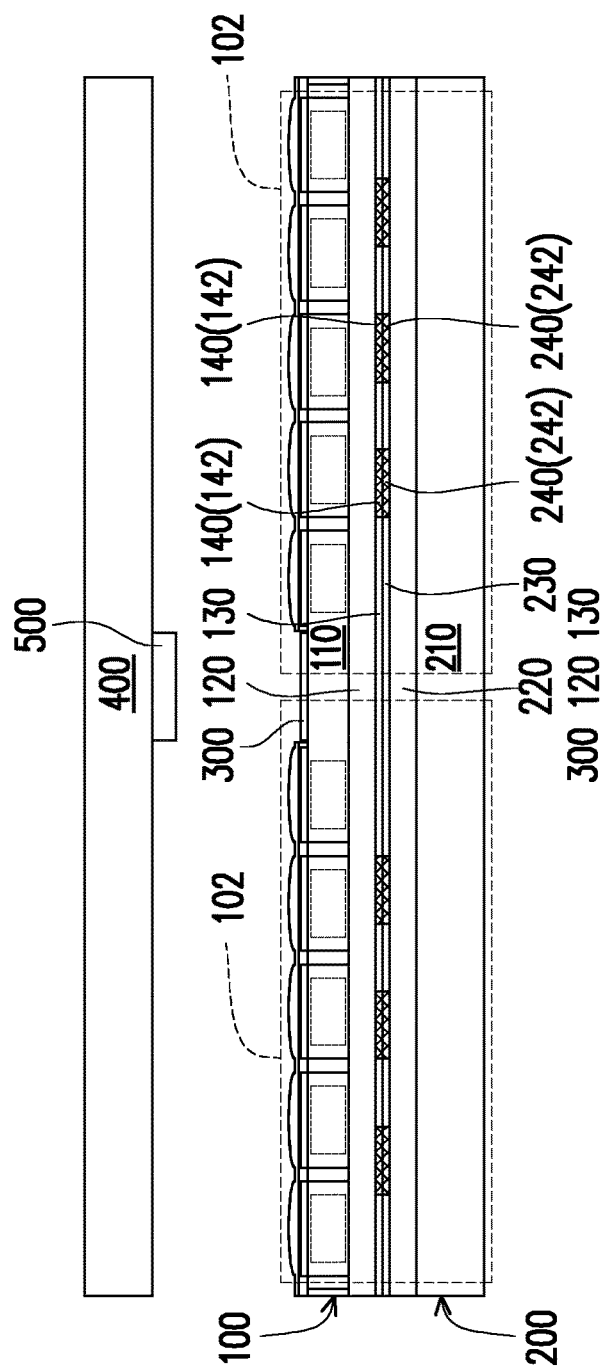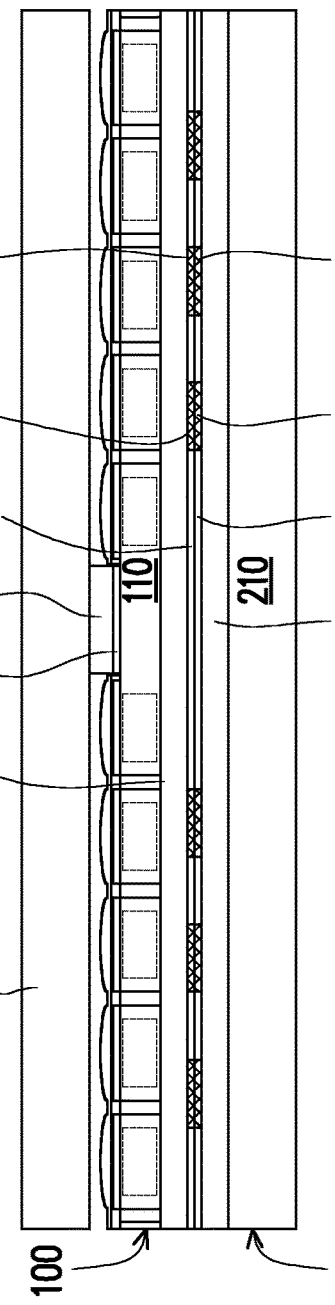

US 10,672,820 B2

HYBRID BONDED STRUCTURE

CROSS-REFERENCE TO RELATED APPLICATION

This application claims the priority benefit of U.S. provisional application Ser. No. 62/590,345, filed on Nov. 23, 2017. The entirety of the above-mentioned patent application is hereby incorporated by reference herein and made a part of this specification.

BACKGROUND

Wafer level hybrid bonding technology for wafer-to-wafer bonding is utilized in fabrication of three-dimensional integrated circuit (3D-IC) components, such as back-side illuminated (BSI) complementary metal-oxide semiconductor (CMOS) image sensors (CIS). When fabricating the BSI-CIS, a sensor wafer including BSI sensing integrated circuits arranged in array and a logic circuit wafer including logic circuit chips arranged in array are provided. The sensor wafer and the logic circuit wafer are bonded with each other through wafer level hybrid bonding technology such that the logic circuit wafer is stacked over the sensor wafer. Thereafter, the hybrid bonded sensor and logic circuit wafers are packaged and singulated to form BSI-CIS devices. During hybrid bonding process of the sensor wafer and the logic circuit wafer, copper extrusion and/or copper migration may generate at the bonding interface of the wafers. Accordingly, reliability of the hybrid bonded wafers deteriorates due to the above-mentioned copper extrusion and/or copper migration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 7 illustrate a process flow for fabricating BSI-CIS devices in accordance with some embodiments of the present disclosure.

DETAILED DESCRIPTION

Figure 1:
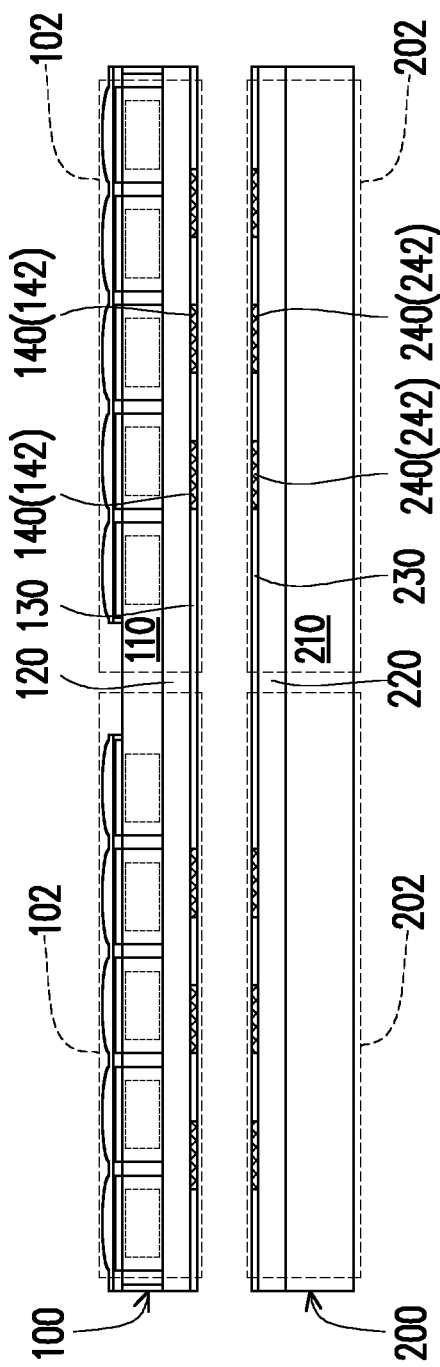

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 7 illustrate a process flow for fabricating BSI-CIS devices in accordance with some embodiments of the present disclosure.

Referring to FIG. 1, a first integrated circuit component 100 and a second integrated circuit component 200 are provided. The first integrated circuit component 100 may include a first semiconductor substrate 110 having a plurality of first semiconductor devices formed therein, a first interconnection structure 120 disposed on the first semiconductor substrate 110, a first dielectric layer 130 covering the first interconnection structure 120 and at least one first conductor group 140. The at least one first conductor group 140 may include a plurality of first conductors 142 which are electrically connected to one another through the first interconnection structure 120. The at least one first conductor group 140 is embedded in the first dielectric layer 130. The second integrated circuit component 200 may include a second semiconductor substrate 210 having a plurality of second semiconductor devices formed therein, a second interconnection structure 220 disposed on the second semiconductor substrate 210, a second dielectric layer 230 covering the second interconnection structure 220 and at least one second conductor group 240. The at least one second conductor group 240 may include a plurality of second conductors 242 which are electrically connected to one another through the second interconnection structure 220. The at least one second conductor group 240 is embedded in the second dielectric layer 230.

As shown in FIG. 1, in some embodiments, the first integrated circuit component 100 may be a first semiconductor wafer (i.e. a sensor wafer) including a plurality of photo-sensing chips 102 arranged in array and the second integrated circuit component 200 may be a second semiconductor wafer (i.e. a logic circuit wafer) including a plurality of logic integrated circuit chips 202 arranged in array. In other words, the first semiconductor substrate 110, the first interconnection structure 120, the first dielectric layer 130 and the at least one first conductor group 140 mentioned above may form the plurality of photo-sensing chips 102 in the first semiconductor wafer; and the second semiconductor substrate 210, the second interconnection structure 220, the second dielectric layer 230 and the at least one second conductor group 240 mentioned above may form the plurality of logic integrated circuit chip 202 in the second semiconductor wafer.

In some embodiments, the material of the first conductors 142 and the second conductors 242 may be copper (Cu) or other suitable metallic material while the material of the first dielectric layer 130 and the second dielectric layer 230 may be silicon oxide ($SiO_x$, where x>0), silicon nitride ($SiN_x$, where x>0), silicon oxynitirde ($SiO_xN_y$, where x>0 and y>0) or other suitable dielectric material. The first conductors 142 may be formed by deposition followed by chemical mechanical polishing (CMP). Similarly, the second conductor 242 may be formed by another deposition followed by chemical mechanical polishing (CMP). The first conductors 142 and the second conductors 242 are helpful to adjust conductor density such that corrosion and/or dishing issue may be minimized.

In some embodiments, to facilitate wafer-to-wafer hybrid bonding, surface preparation for bonding surfaces of the first integrated circuit component 100 and the second integrated circuit component 200 is performed. The surface preparation may include surface cleaning and activation, for example. Surface cleaning may be performed on the bonding surfaces of the first integrated circuit component 100 and the second integrated circuit component 200 so as to remove particles on top surfaces of the first conductors 142, the first dielectric layer 130, the second conductors 242 and the second dielectric layer 230. The bonding surfaces of the first integrated circuit component 100 and the second integrated circuit component 200 may be cleaned by wet cleaning, for example. Not only particles are removed, but also native oxide formed on the top surfaces of the first conductors 142 and the second conductors 242 may be removed. The native oxide formed on the top surfaces of the first conductors 142 and the second conductors 242 may be removed by chemicals used in the wet cleaning, for example.

After cleaning the bonding surfaces of the first integrated circuit component 100 and the second integrated circuit component 200, activation of the top surfaces of the first dielectric layer 130 and the second dielectric layer 230 may be performed for development of high bonding strength. In some embodiments, plasma activation may be performed to treat the top surfaces of the first dielectric layer 130 and the second dielectric layer 230.

Figure 2:
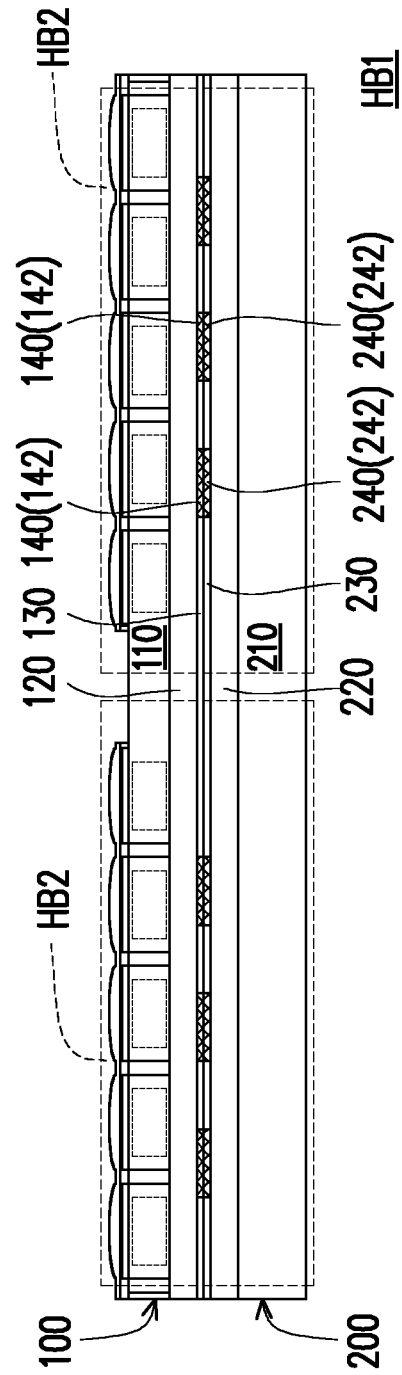

Referring to FIG. 1 and FIG. 2, the first integrated circuit component 100 is aligned with the second integrated circuit component 200 and sub-micron alignment precision may be achieved. Once the first integrated circuit component 100 and the second integrated circuit component 200 are aligned precisely, the first integrated circuit component 100 is placed on and in contact with the second integrated circuit component 200. When the activated top surface of the first dielectric layer 130 is in contact with the activated top surface of the second dielectric layer 230, the first dielectric layer 130 of the first integrated circuit component 100 and the second dielectric layer 230 of the second integrated circuit component 200 are pre-bonded. In other words, the first integrated circuit component 100 and the second integrated circuit component 200 are pre-bonded through the pre-bonding of the first dielectric layer 130 and the second dielectric layer 230. After the pre-bonding of the first dielectric layer 130 and the second dielectric layer 230, the first conductors 142 are in contact with the second conductors 242.

After pre-bonding the first integrated circuit component 100 onto the second integrated circuit component 200, a hybrid bonding of the first integrated circuit component 100 and the second integrated circuit component 200 is performed. The hybrid bonding of the first integrated circuit component 100 and the second integrated circuit component 200 may include a treatment for dielectric bonding and a thermal annealing for conductor bonding. In some embodiments, the treatment for dielectric bonding is performed to strengthen the bonding between the first dielectric layer 130 and the second dielectric layer 230. For example, the treatment for dielectric bonding may be performed at temperature ranging from about 100 Celsius degree to about 150 Celsius degree. After performing the treatment for dielectric bonding, the thermal annealing for conductor bonding is performed to facilitate the bonding between the first conductors 142 and the second conductors 242. For example, the thermal annealing for conductor bonding may be performed at temperature ranging from about 300 Celsius degree to about 400 Celsius degree. The process temperature of the thermal annealing for conductor bonding is higher than that of the treatment for dielectric bonding. Since the thermal annealing for conductor bonding is performed at relative higher temperature, metal diffusion and grain growth may occur at bonding interfaces between the first conductors 142 and the second conductors 242. On the other hand, when the thermal annealing for conductor bonding is performed, the first conductors 142 and the second conductors 242 may suffer pressure resulted from the coefficient of thermal expansion (CTE) mismatch between the conductors (142, 242) and the dielectric layers (130, 230). After performing the thermal annealing for conductor bonding, the first dielectric layer 130 is bonded to the second dielectric layer 230 and the first conductors 140 are bonded to the second conductors 240. In some embodiments, the first conductors 140 may be conductive vias (e.g., copper vias), conductive pads (e.g., copper pads) or the combinations thereof while the second conductors 240 may be conductive vias (e.g., copper vias), conductive pads (e.g., copper pads) or the combinations thereof. For example, the conductor bonding between the first conductors 140 and the second conductors 240 may be via-to-via bonding, pad-to-pad bonding or via-to-pad bonding.

After the hybrid bonding of the first integrated circuit component 100 and the second integrated circuit component 200 is performed, the first interconnection structure 120 and the second interconnection structure 220 are electrically connected to each other through the first conductors 142 and the second conductors 242.

After the first integrated circuit component 100 and the second integrated circuit component 200 are hybrid bonded, a hybrid bonded structure HB1 including stacked and hybrid bonded wafers is accomplished, as shown in FIG. 2. In some embodiments, the hybrid bonded structure HB1 may be singulated into a plurality of singulated hybrid bonded structures HB2 if necessary and each of singulated hybrid bonded structures HB2 includes stacked and hybrid bonded chips. In other words, each of singulated hybrid bonded structures HB2 may include a logic integrated circuit chip and a photo-sensing chip, wherein the photo-sensing chip is stacked over and hybrid bonded with the logic integrated circuit chip. In the above-mentioned embodiments, the hybrid bonded structure HB1 includes hybrid bonded wafers and the hybrid bonded structure HB2 includes hybrid bonded chips. However, the disclosure is not limited thereto. In some alternative embodiments, the hybrid bonded structure (not shown) may include a wafer and at least one chip that is stacked and hybrid bonded on the wafer.

Referring to FIG. 3 and FIG. 4, an adhesive 300 is formed on the back surface of the first semiconductor substrate 110.

The adhesive 300 is formed to cover the periphery regions of the photo-sensing chips 102 so as to surround sensing regions of the photo-sensing chips 102, for example. A cover lid 400 having a spacer 500 disposed on the bottom surface of the cover lid 400 is provided. The cover lid 400 may be utilized to cover the hybrid bonded structure HB1 and the position of the spacer 500 corresponds to the distribution of the adhesive 300. Through the adhesive 300 formed on the hybrid bonded structure HB1, the spacer 500 is adhered with the hybrid bonded structure HB1 and a gap is formed between the cover lid 400 and the hybrid bonded structure HB1. Since the cover lid 400 is spaced apart from the hybrid bonded structure HB1 by the spacer 500 and the gap, components formed on the hybrid bonded structure HB1 are not in contact with the cover lid 400 and may be well protected. For example, the material of adhesive 300 may be organic material with suitable insulation characteristics, the cover lid 400 may be a cover glass with or without optical coating (e.g., an anti-reflection coating), and the spacer 500 may be epoxy resin or other suitable material.

In some embodiments, after the cover lid 400 and spacer 500 are adhered to the hybrid bonded structure HB1, a grinding process may be performed on the back surface of the second semiconductor substrate 210 so as to further reduce the thickness of the hybrid bonded structure HB1.

Figure 5:
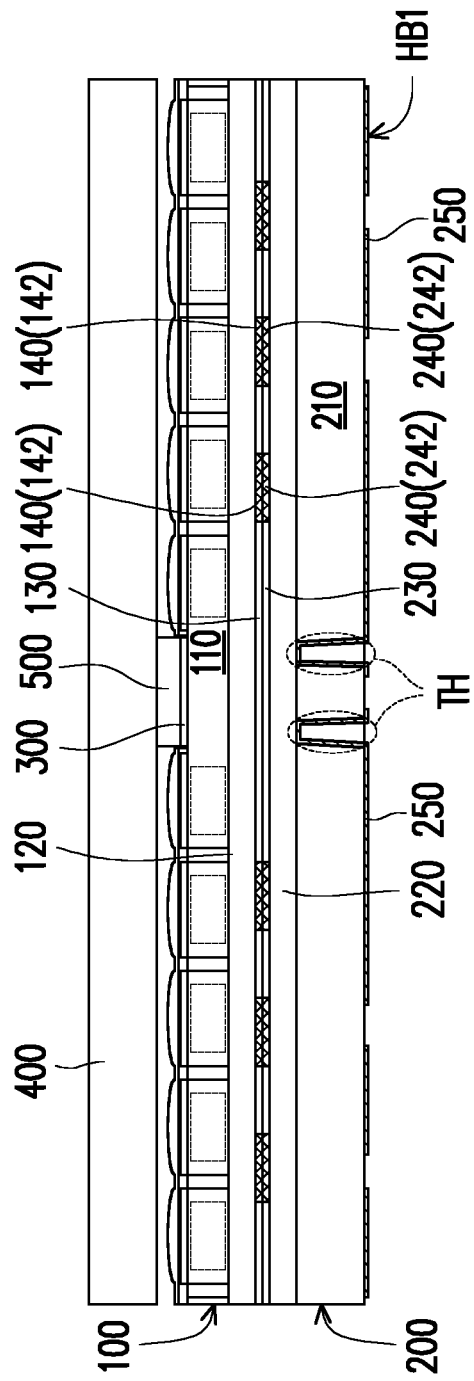

Referring to FIG. 5, after the cover lid 400 and the spacer 500 are adhered with the hybrid bonded structure HB1 through the adhesive 300, a plurality of through holes TH are formed in the second semiconductor substrate 210 by, for example, through silicon via (TSV) process until the second interconnection structure 220 of the second integrated circuit component 200 is revealed. Thereafter, a redistribution layer 250 electrically connected to the second interconnection structure 220 through the through holes TH is formed on the back surface (i.e. the lower surface) of the second semiconductor substrate 210. Before forming the redistribution layer 250, an insulating layer (not shown) may be formed on the back surface of the second semiconductor substrate 210 and sidewalls of the through holes TH so as to electrically insulate the redistribution layer 250 from the second semiconductor substrate 210. As shown in FIG. 5, the redistribution layer 250 redistributes the first interconnection structure 120 and the second interconnection structure 220 to the back surface of the second semiconductor substrate 210. In some embodiments, although not shown in figures, the second interconnection structure 220 may include landing pads, the landing pads may be revealed by the through holes TH, and the redistribution layer 250 may electrically connected to the landing pads through the through holes TH.

Figure 6:
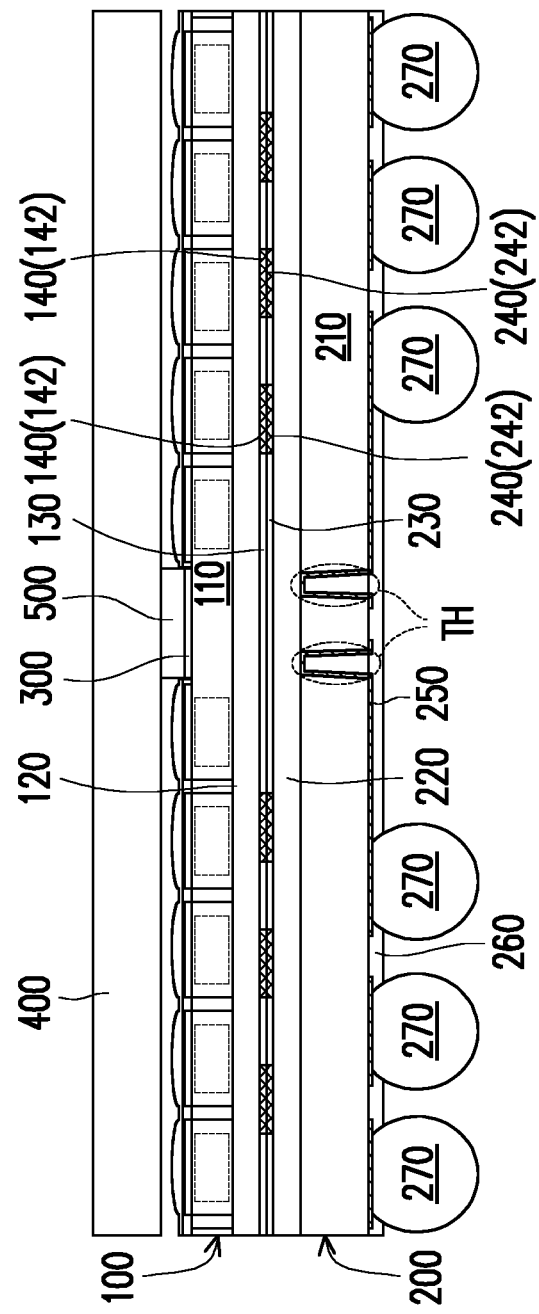

Referring to FIG. 6, a passivation layer 260 is formed on the back surface of the second semiconductor substrate 210 to partially cover the redistribution layer 250. The passivation 260 may include a plurality of opening for partially exposing the redistribution layer 250 (e.g., ball pads of the redistribution layer 250). After the passivation layer 260 is formed, a plurality of conductive terminals 270 (e.g., conductive balls) arranged in array are formed on portions of the redistribution layer 250 exposed by the openings of the passivation 260. The conductive terminals 270 may be solder balls formed by ball placement and reflowing processes.

Figure 7:
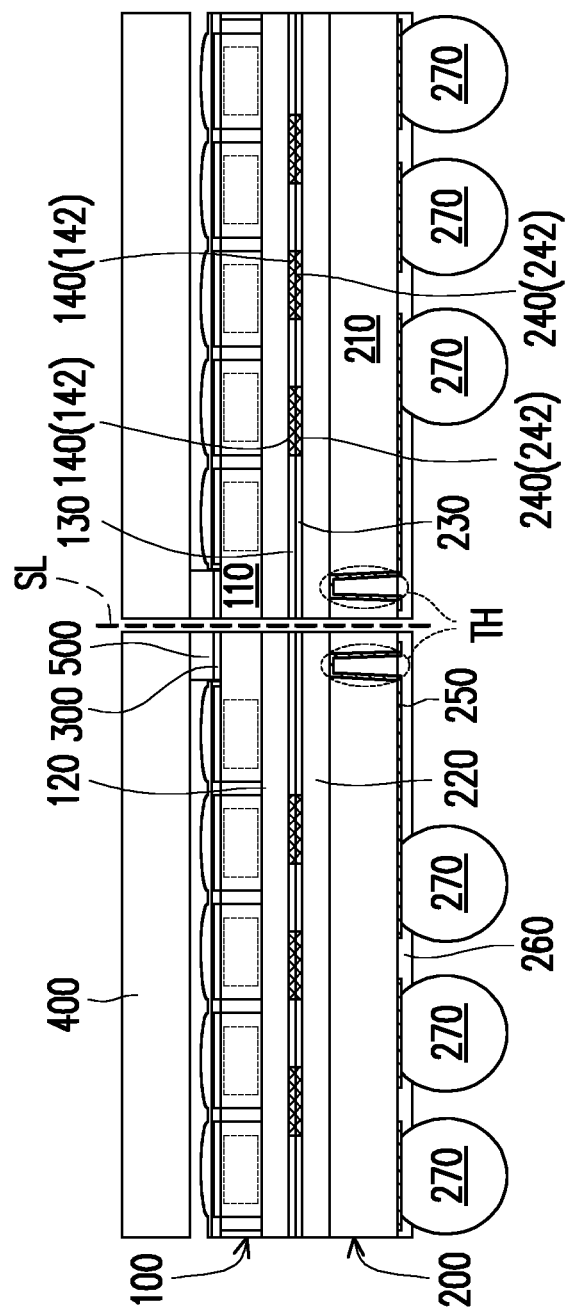

Referring to FIG. 6 and FIG. 7, after forming the conductive terminals 270, a dicing process is performed along scribe line SL to singulate the resulted structure shown in FIG. 6 into a plurality of BSI-CIS devices. As shown in FIG. 7, the singulated BSI-CIS devices may be ball grid array (BGA) devices.

The reliability of the BSI-CIS devices may be affected by the hybrid bonded structure HB1. Electrical connection between the first integrated circuit component 100 and the second integrated circuit component 200 may fail (i.e. electrical open and short issues) because of extrusion (e.g., copper extrusion) and/or migration (e.g., electrical migration, thermal migration and/or stress migration) may occur at the hybrid bonding interface. Novel design of the first interconnection structure 120 and the second interconnection structure 220 is required for resolving the extrusion and migration issue. The details of the first interconnection structure 120 and the second interconnection structure 220 are described as following in accompany with FIGS. 8 through 18.

Figure 8:
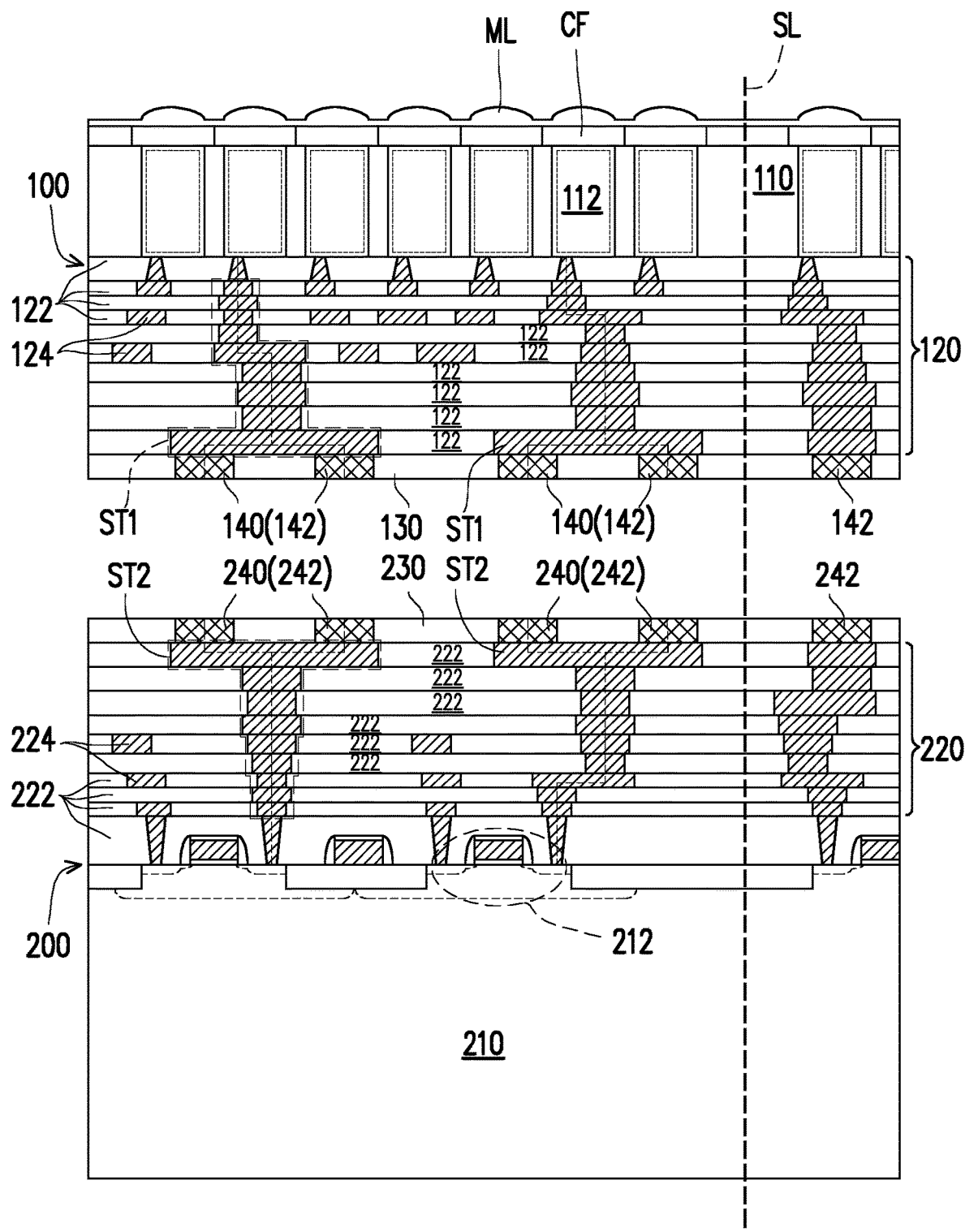
FIG. 8 and FIG. 9 are cross-sectional views illustrating a hybrid bonding process of wafers in accordance with some embodiments of the present disclosure.
Figure 9:
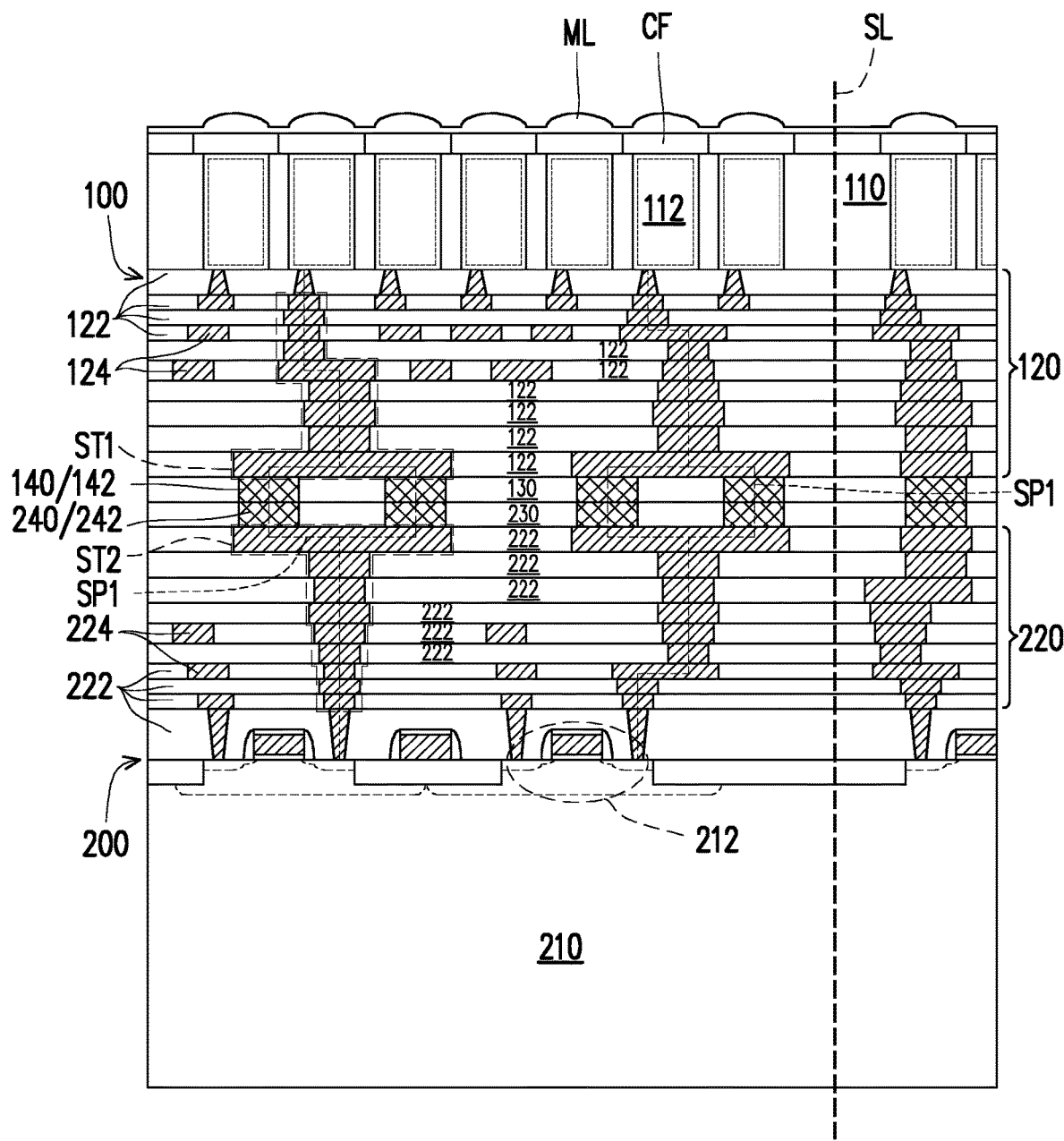

FIG. 8 and FIG. 9 are cross-sectional views illustrating a hybrid bonding process of wafers in accordance with some embodiments of the present disclosure.

Referring to FIG. 8 and FIG. 9, in some embodiments, the first integrated circuit component 100 may include a plurality of first semiconductor devices 112 (e.g., photo diodes, transistors, capacitors and so on) formed in or on the first semiconductor substrate 110 and a micro-lens array ML formed on the back surface (i.e. the upper surface) of the first semiconductor substrate 110. The first semiconductor devices 112 formed in the first semiconductor substrate 110 may be arranged in array and may be covered by the micro-lens array ML formed on the back surface of the first semiconductor substrate 110. In some alternative embodiments, the first integrated circuit component 100 may further include a plurality of color filters CF formed between the micro-lens array ML and the first semiconductor devices 112. In other words, the color filters CF are formed on the back surface of the first semiconductor substrate 110 and the micro-lens array ML is formed on the color filters CF. Based on actual design requirements, other optical components (e.g., black matrix) for enhancing optical characteristics of the first semiconductor devices 112 in the first integrated circuit component 100 may be formed.

Furthermore, in some embodiments, the second integrated circuit component 200 may include a plurality of second semiconductor devices 212 (e.g., transistors, capacitors and so on) formed in or on the second semiconductor substrate 210. In some embodiments, the second semiconductor devices 212 and the first interconnection structure 120 may constitute logic circuitry.

As shown in FIG. 8 and FIG. 9, although two groups of first conductors 142 and two groups of second conductors 242 are shown, the disclosure does not limit the number of the groups of first conductors 142 formed on the first integrated circuit component 100 and the number of the groups of second conductors 242 formed on the second integrated circuit component 200. Furthermore, the disclosure does not limit the number of conductors (142 or 242) included in each conductor group (140 or 240). In this embodiment, two conductors 142 are included in one conductor group 140 and two conductors 242 are included in one conductor group 240, for example.

The first conductor groups 140 may be electrically connected to the first semiconductor devices 112 through first shunt traces ST1 in the first interconnection structure 120. In other words, at least one of the first conductor groups 140 may be electrically connected to one of the first semiconductor devices 112 through one corresponding first shunt traces ST1 in the first interconnection structure 120. The number of the first shunt traces ST1 may equal to the number of the first conductor groups 140. In some embodiments, the first interconnection structure 120 may include inter-dielectric layers 122 and interconnection metal layers 124. The interconnection metal layers 124 are electrically connected between the first conductor groups 140 and the first semiconductor devices 112. The first shunt traces ST1 in the first interconnection structure 120 may be formed by portions of interconnection metal layers 124. Similarly, the second conductor groups 240 may be electrically connected to the second semiconductor devices 212 through second shunt traces ST2 in the second interconnection structure 220. In other words, at least one of the second conductor groups 240 may be electrically connected to one of the second semiconductor devices 212 through one corresponding second shunt traces ST2 in the second interconnection structure 220. The number of the second shunt traces ST2 may equal to the number of the second conductor groups 240. In some embodiments, the second interconnection structure 220 may include inter-dielectric layers 222 and interconnection metal layers 224. The interconnection metal layers 224 are electrically connected between the second conductor groups 240 and the second semiconductor devices 212. The second shunt traces ST2 in the second interconnection structure 220 may be formed by portions of interconnection metal layers 224.

The first conductors 142 included in one of the first conductor groups 140 are directly in contact with and connected to one topmost metal pattern (i.e. the bottommost metal layer) of interconnection metal layers 124. Similarly, the second conductors 242 included in one of the second conductor groups 240 are directly in contact with and connected to one topmost metal pattern (i.e. the topmost metal layer) of the interconnection metal layers 224. In other words, the first conductors 142 and the second conductors 242 are located between the topmost metal pattern of the interconnection metal layers 124 and the topmost metal pattern of interconnection metal layers 224.

As shown in FIG. 8, before hybrid bonding the first integrated circuit component 100 and the second integrated circuit component 200, the first integrated circuit component 100 and the second integrated circuit component 200 are cleaned and are aligned with each other for pre-bonding. In other words, the first conductor groups 140 on the first integrated circuit component 100 and the second conductor groups 240 one the second integrated circuit component 200 are aligned in advance before hybrid bonding.

As shown in FIG. 9, after hybrid bonding the first integrated circuit component 100 and the second integrated circuit component 200, the first shunt traces ST1, the second shunt traces ST2, the first conductors 142 (i.e. the first conductor groups 140) and the second conductors 242 (i.e. the first conductor groups 140) provide a plurality of shunt paths SP1 in the first integrated circuit component 100 and the second integrated circuit component 200. The first semiconductor devices 112 may electrically connect to the second semiconductor devices 212 through the shunt paths SP1. In this embodiment, each one of the shunt paths SP1 includes two connection paths for transmitting current between the first semiconductor devices 112 and the second semiconductor devices 212. However, the number of the connection paths in each one of shunt paths SP1 is not limited in this disclosure. In some alternative embodiments, the numbers of the connection paths included in different shunt paths SP1 may be the same or different.

The first shunt traces ST1 and the second shunt traces ST2 may spread current that flows between the first semiconductor devices 112 and the second semiconductor devices 212 so as to reduce current density in the first shunt traces ST1 and the second shunt traces ST2. Reduction of current density in the first shunt traces ST1 and the second shunt traces ST2 may minimize electrical migration (e.g., copper migration) occurred at the hybrid bonded interfaces between the first integrated circuit component 100 and the second integrated circuit component 200. The shunt traces ST1 and the second shunt traces ST2 and the hybrid bond conductors 142/242 may provide lower resistivity. Furthermore, the first shunt traces ST1 and the second shunt traces ST2 may spread stress suffered by the first conductors 142 and the second conductors 242 during the hybrid bonding. Spreading of stress suffered by the first conductors 142 and the second conductors 242 may minimize stress migration occurred at the hybrid bonded interfaces between the first integrated circuit component 100 and the second integrated circuit component 200. Accordingly, yield rate of the hybrid bonding may increase due to the first shunt traces ST1 and the second shunt traces ST2.

During the above-mentioned treatment for dielectric bonding, open and/or short circuit issues resulted from thermal migration may be minimized by the design of the first interconnection structure 120 and the second interconnection structure 220. During the above-mentioned thermal annealing for conductor bonding, not only open and/or short circuit issues resulted from thermal migration and stress migration, but also extrusion issue resulted from CTE mismatch may occur may be minimized by the design of the first interconnection structure 120 and the second interconnection structure 220. During the above-mentioned grinding process for reducing the thickness of the hybrid bonded structure HB1 (shown in FIG. 4), extrusion issue and stress migration may occur resulted from stress may be minimized by the design of the first interconnection structure 120 and the second interconnection structure 220. During the operation of the BSI-CIS devices, opening/short circuit issue resulted from electrical migration may be minimized by the design of the first interconnection structure 120 and the second interconnection structure 220. To sum up, the aforesaid extrusion and migration may be minimized by the design of the first interconnection structure 120 and the second interconnection structure 220.

Figure 10:
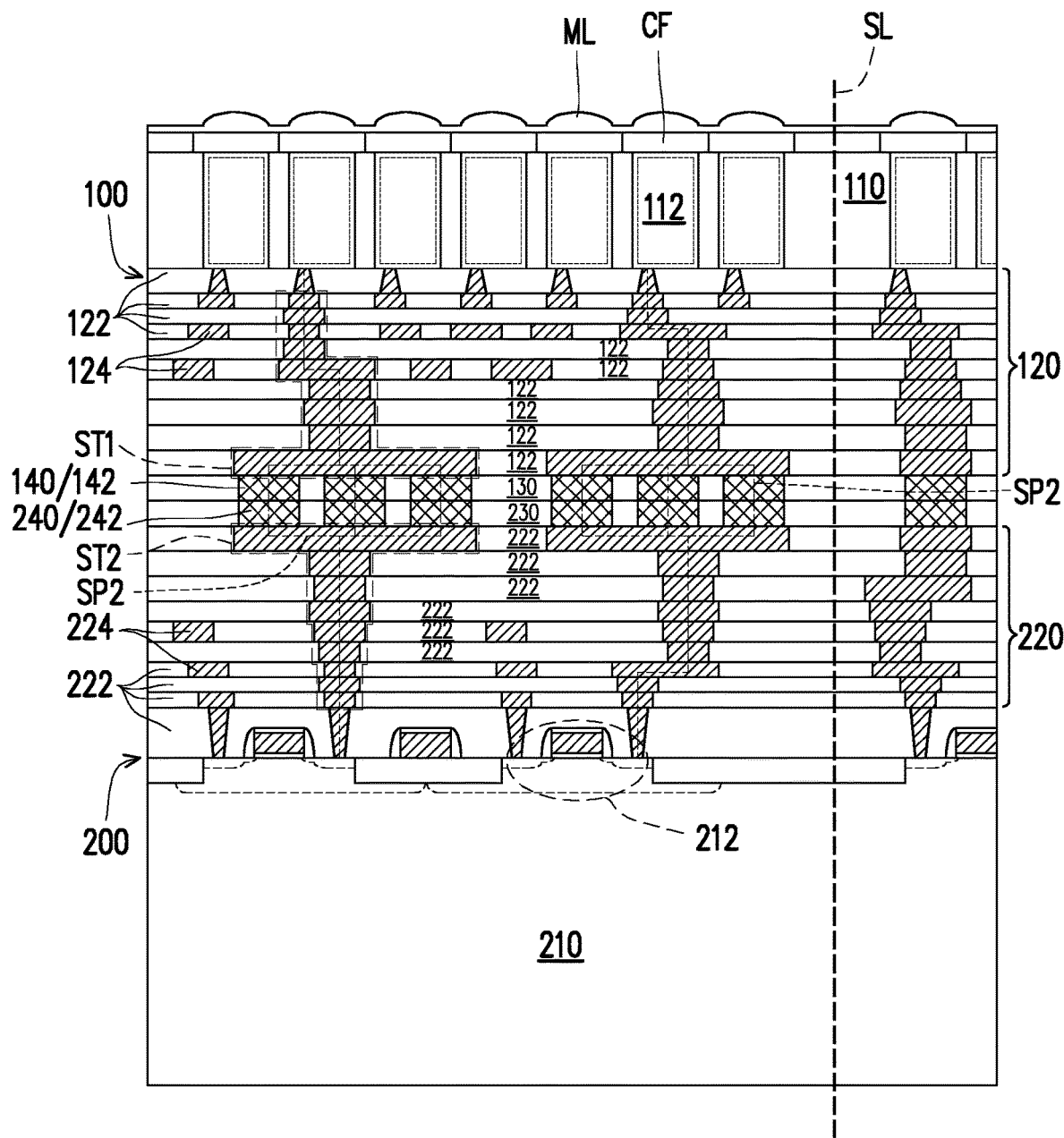
FIG. 10 is a cross-sectional view of a hybrid bonded structure in accordance with some embodiments of the present disclosure.

FIG. 10 is a cross-sectional view of a hybrid bonded structure in accordance with some embodiments of the present disclosure.

Referring to FIG. 9 and FIG. 10, the hybrid bonded structure shown in FIG. 10 is similar with that shown in FIG. 9 except that three first conductors 142 are included in each of the first conductor groups 140 and three second conductors 242 are included in each of the second conductor groups 240. In addition, in this embodiment, each one of the shunt paths SP2 includes three connection paths for transmitting current between the first semiconductor devices 112 and the second semiconductor devices 212, for example. However, the number of the connection paths in each one of shunt paths SP2 is not limited in this disclosure. In some alternative embodiments, the numbers of the connection paths included in different shunt paths SP2 may be the same or different.

Figure 11:
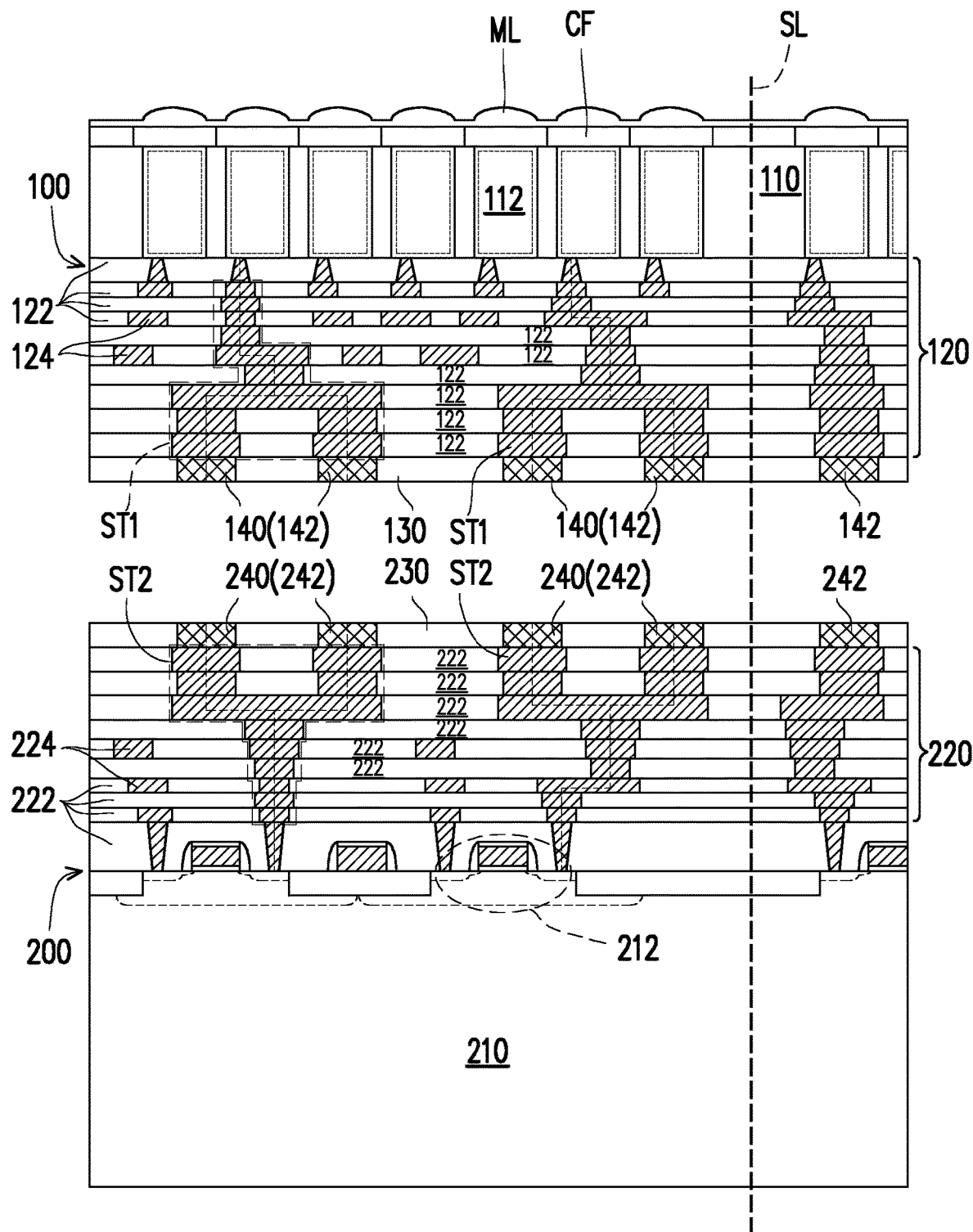
FIG. 11 and FIG. 12 are cross-sectional views illustrating a hybrid bonding process of wafers in accordance with some alternative embodiments of the present disclosure.
Figure 12:
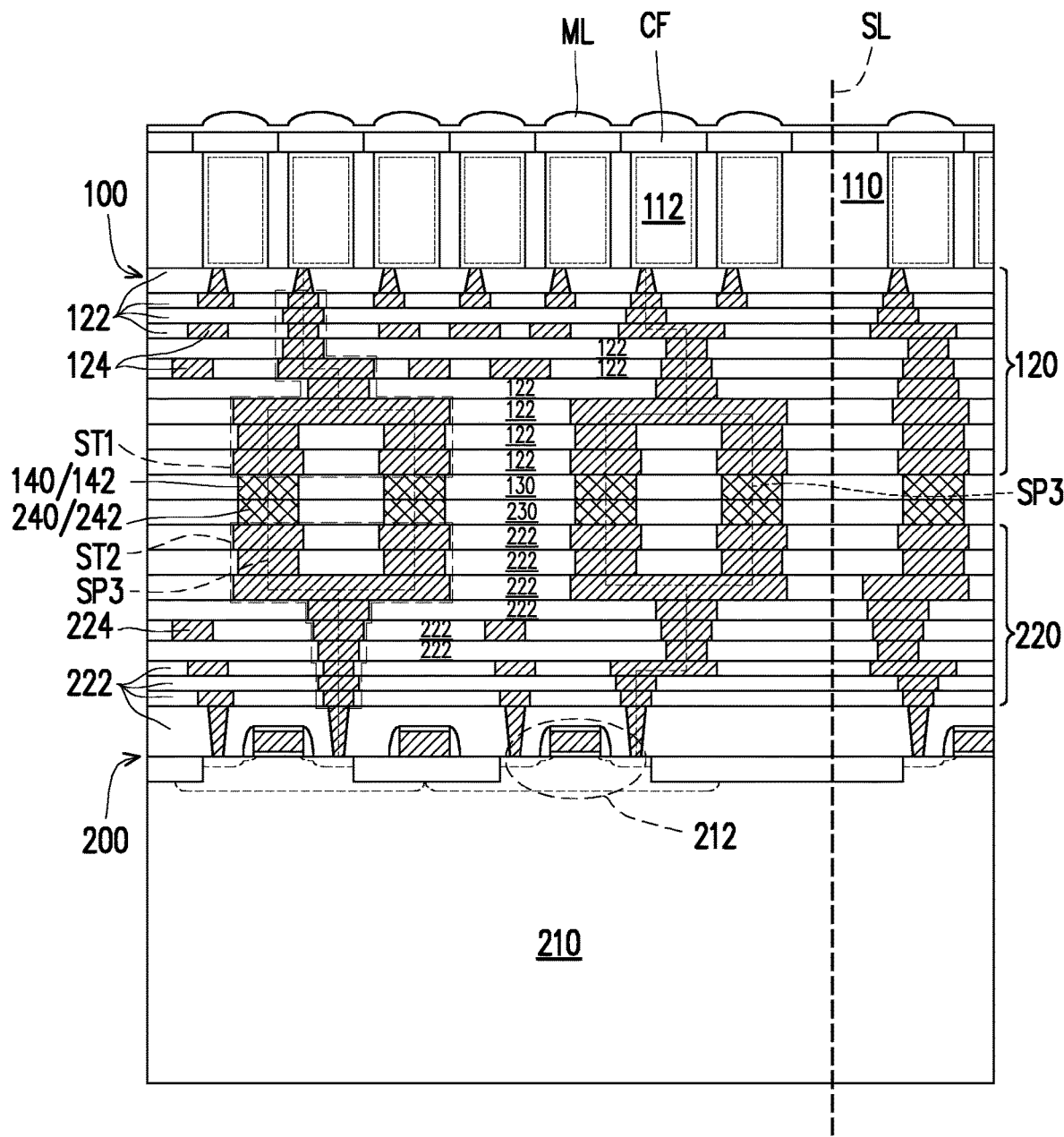

FIG. 11 and FIG. 12 are cross-sectional views illustrating a hybrid bonding process of wafers in accordance with some alternative embodiments of the present disclosure.

Referring to FIGS. 8, 9, 11 and 12, the first interconnection structure 120 and the second interconnection structure 220 illustrated in FIGS. 11 and 12 are similar with those illustrated in FIGS. 8 and 9 except that the first conductors 142 included in one of the first conductor groups 140 are in contact with a plurality of topmost metal patterns (i.e. the bottommost metal layer) of interconnection metal layers 124, and the first conductors 142 included in one of the first conductor groups 140 are electrically connected to each other by one metal pattern located above the topmost metal patterns. Similarly, the second conductors 242 included in one of the second conductor groups 240 are in contact with a plurality of topmost metal patterns (i.e. the bottommost metal layer) of interconnection metal layers 224, and the second conductors 242 included in one of the second conductor groups 240 are electrically connected to each other by one metal pattern located below the topmost metal patterns.

The first conductor groups 140 may be electrically connected to the first semiconductor devices 112 through first shunt traces ST1 in the first interconnection structure 120. In other words, at least one of the first conductor groups 140 may be electrically connected to one of the first semiconductor devices 112 through one corresponding first shunt traces ST1 in the first interconnection structure 120. The number of the first shunt traces ST1 may equal to the number of the first conductor groups 140. In some embodiments, the first interconnection structure 120 may include inter-dielectric layers 122 and interconnection metal layers 124. The interconnection metal layers 124 are electrically connected between the first conductor groups 140 and the first semiconductor devices 112. The first shunt traces ST1 in the first interconnection structure 120 may be formed by portions of interconnection metal layers 124. Similarly, the second conductor groups 240 may be electrically connected to the second semiconductor devices 212 through second shunt traces ST2 in the second interconnection structure 220. In other words, at least one of the second conductor groups 240 may be electrically connected to one of the second semiconductor devices 212 through one corresponding second shunt traces ST2 in the second interconnection structure 220. The number of the second shunt traces ST2 may equal to the number of the second conductor groups 240. In some embodiments, the second interconnection structure 220 may include inter-dielectric layers 222 and interconnection metal layers 224. The interconnection metal layers 224 are electrically connected between the second conductor groups 240 and the second semiconductor devices 212. The second shunt traces ST2 in the second interconnection structure 220 may be formed by portions of interconnection metal layers 224. In other words, not only the first conductors 142 and the second conductors 242 are located between the topmost metal pattern of the interconnection metal layers 124 and the topmost metal pattern of interconnection metal layers 224, but also portions of the interconnection metal layers 124 and 224 are sandwiched between the topmost metal pattern of the interconnection metal layers 124 and the topmost metal pattern of interconnection metal layers 224.

FIGS. 13 through 18 are cross-sectional views illustrating hybrid bonded structures in accordance with various embodiments of the present disclosure.

Figure 13:
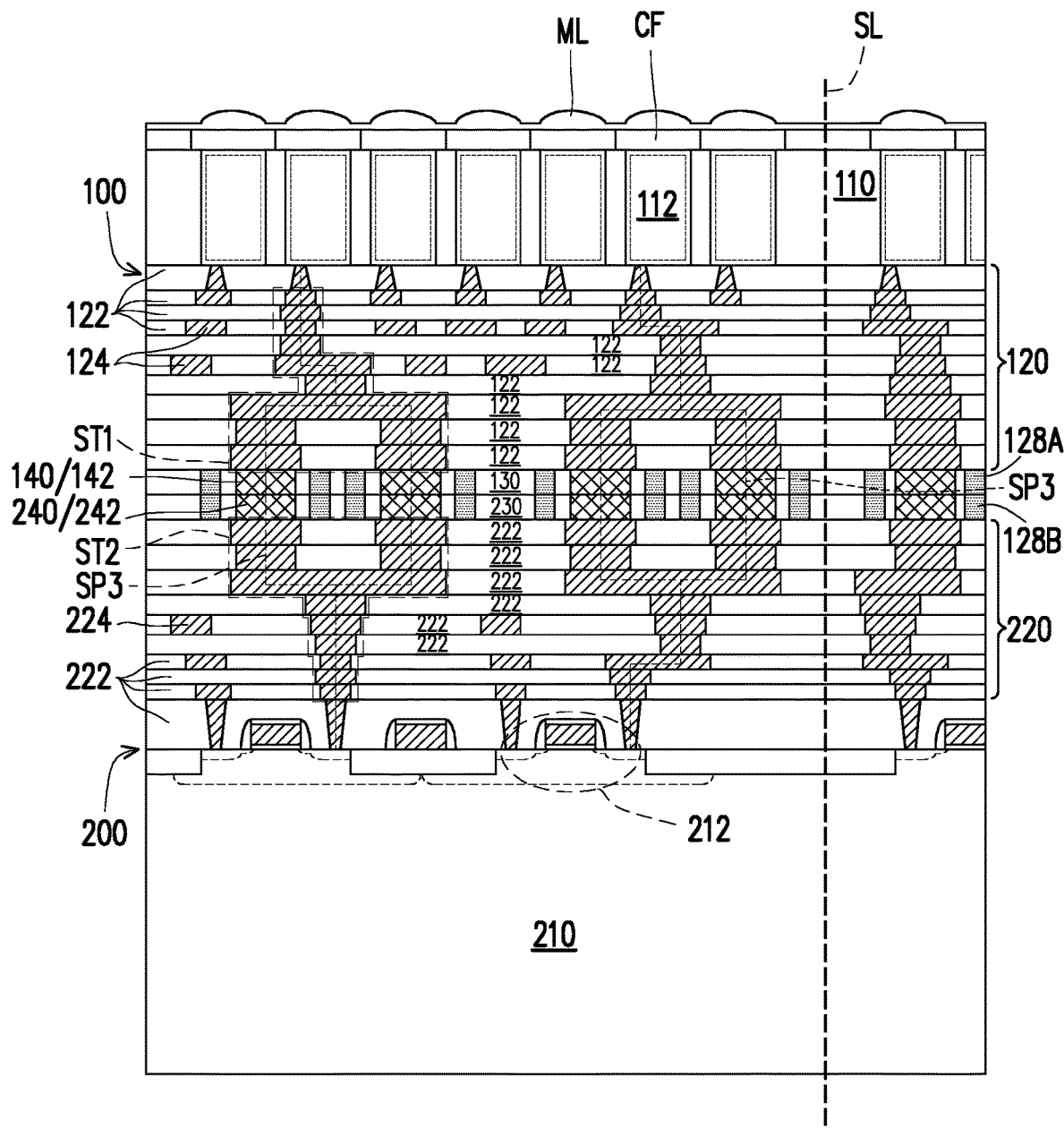
FIGS. 13 through 18 are cross-sectional views illustrating hybrid bonded structures in accordance with various embodiments of the present disclosure.

Referring to FIG. 13, the first interconnection structure 120 and the second interconnection structure 220 illustrated in FIG. 13 are similar with those illustrated in FIGS. 11 and 12 except that a plurality of isolation structures each including an isolation portion 128A and an isolation portion 128B are further included in the first interconnection structure 120. The isolation portions 128A of the isolation structures are electrically insulated from the first conductors 142 and each of the first conductors 142 is surrounded by one of the isolation portions 128A. Furthermore, a plurality of isolation portions 128B of the isolation structures are electrically insulated from the second conductors 242 and each of the second conductors 242 is surrounded by one of the isolation portions 128B. The isolation portions 128A are embedded in the first dielectric layer 130 and the isolation portions 128B are embedded in the second dielectric layer 230. The isolation portions 128A are electrically floated and are separated from one another while the isolation portions 128B are electrically floated and are separated from one another. As shown in FIG. 13, each of the isolation portions 128A is hybrid bonded with one of the isolation portions 128B respectively. In some embodiments, the isolation portions 128A and the first conductors 142 may be formed by the same process and made by the same material while the isolation portions 128B and the second conductors 242 may be formed by the same process and made by the same material. For example, the isolation portions 128A, the first conductors 142, the isolation portions 128B and the second conductors 242 may be formed by the same material, such as copper or other suitable metallic material.

The first conductors 142 and the isolation portions 128A may be formed by deposition followed by chemical mechanical polishing (CMP). Similarly, the second conductors 242 and the isolation portions 128B may be formed by another deposition followed by chemical mechanical polishing (CMP). The first conductors 142, the isolation portions 128B, the second conductors 242 and the isolation portions 128B are helpful to adjust conductor density such that corrosion and/or dishing issue may be minimized. Furthermore, the electrical floated isolation portions 128A and 128B may restrain open/short circuit issue resulted from the migration issue of the first conductors 142 and the second conductors 242.

Figure 14:
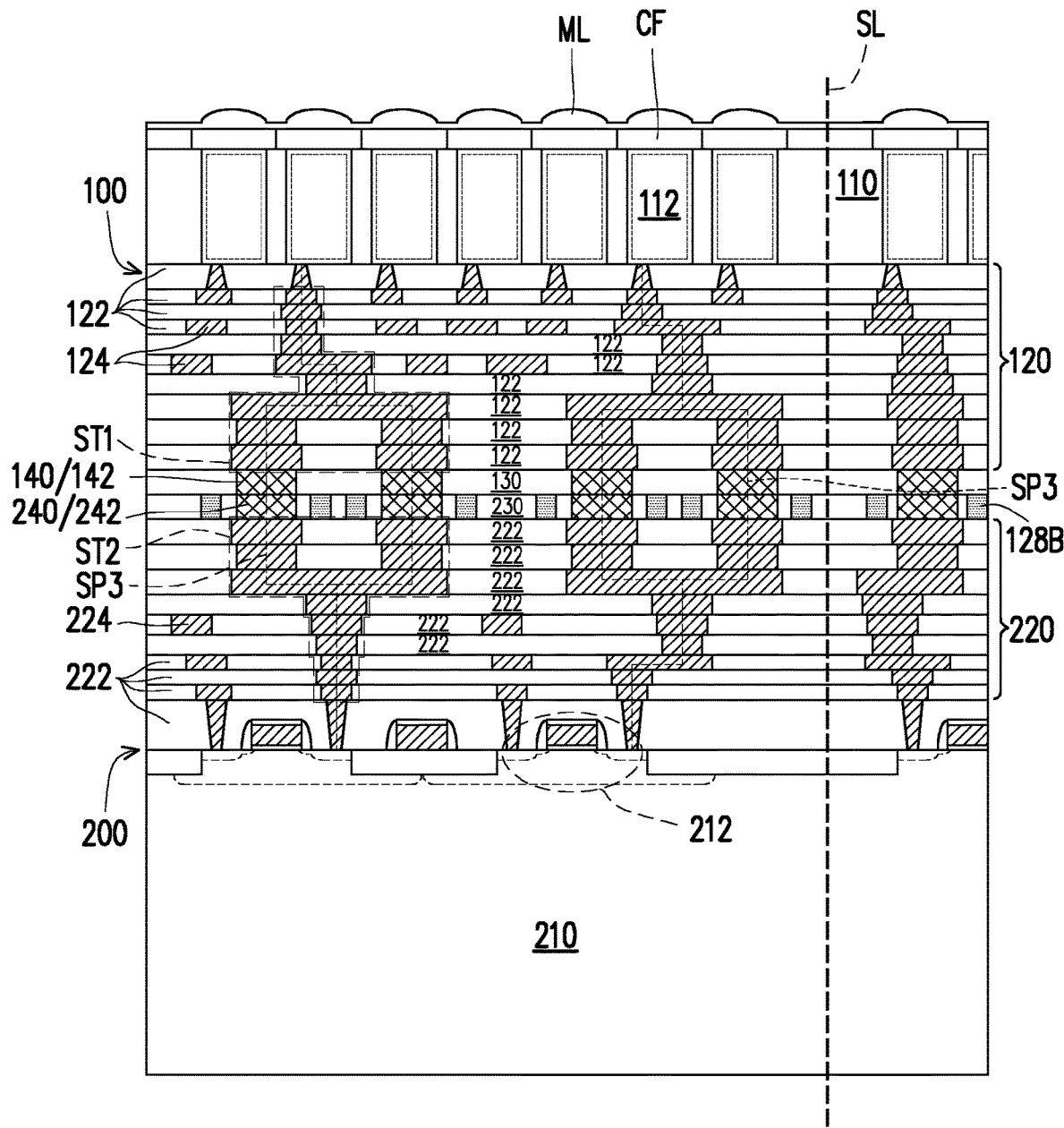

Referring to FIG. 14, the first interconnection structure 120 and the second interconnection structure 220 illustrated in FIG. 14 are similar with those illustrated in FIG. 13 except that the isolation portions 128A in the first interconnection structure 120 (as shown in FIG. 13) are omitted. In some embodiments, the isolation portions 128B and the second conductors 242 may be formed by the same process and made by the same material. For example, the isolation portions 128B, the first conductors 142 and the second conductors 242 may be formed by the same material, such as copper or other suitable metallic material.

Figure 15:
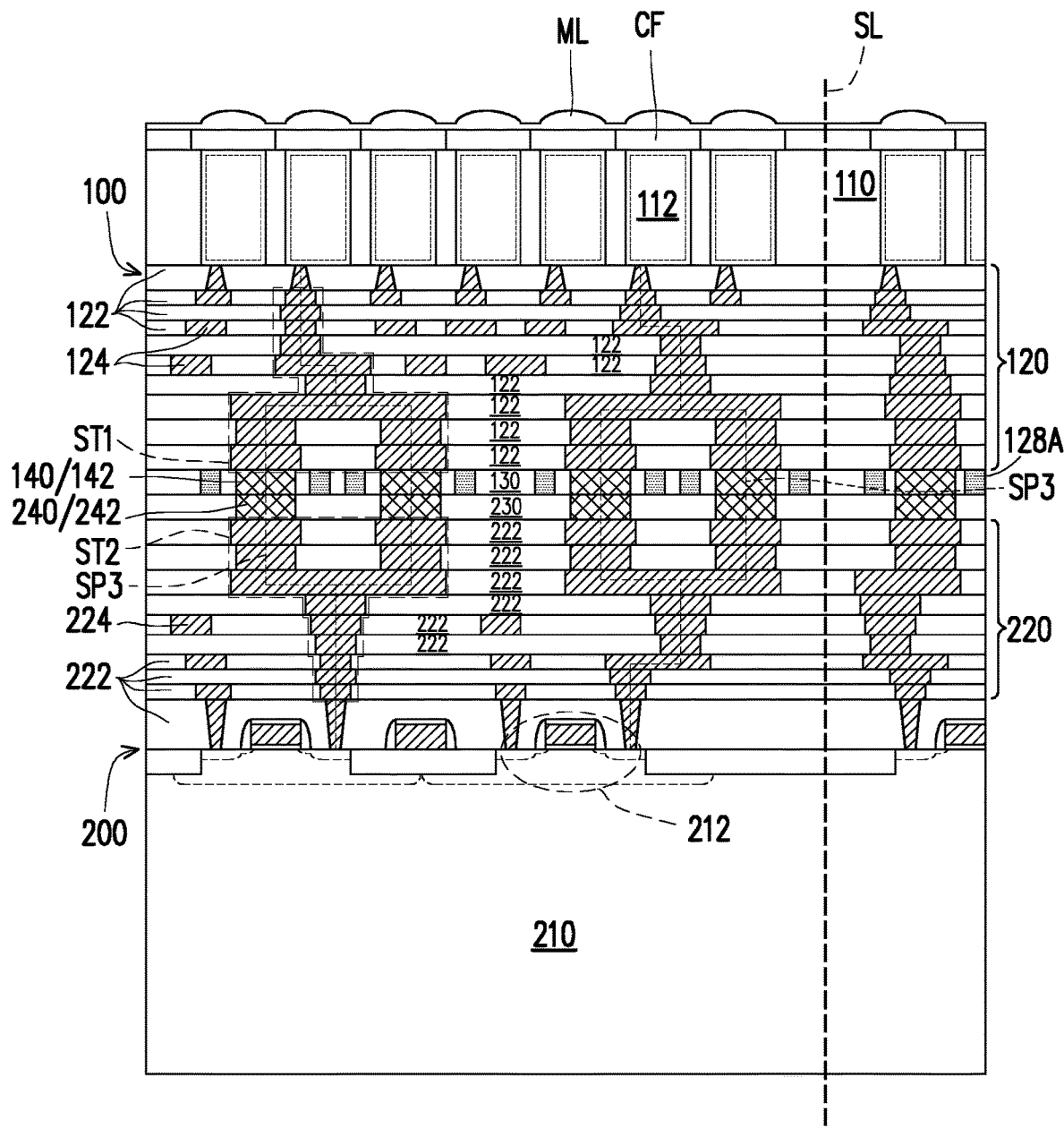

Referring to FIG. 15, the first interconnection structure 120 and the second interconnection structure 220 illustrated in FIG. 15 are similar with those illustrated in FIG. 13 except that the isolation portions 128B in the second interconnection structure 220 (as shown in FIG. 13) are omitted. In some embodiments, the isolation portions 128A and the first conductors 142 may be formed by the same process and made by the same material. For example, the isolation portions 128A, the first conductors 142 and the second conductors 242 may be formed by the same material, such as copper or other suitable metallic material.

Figure 16:
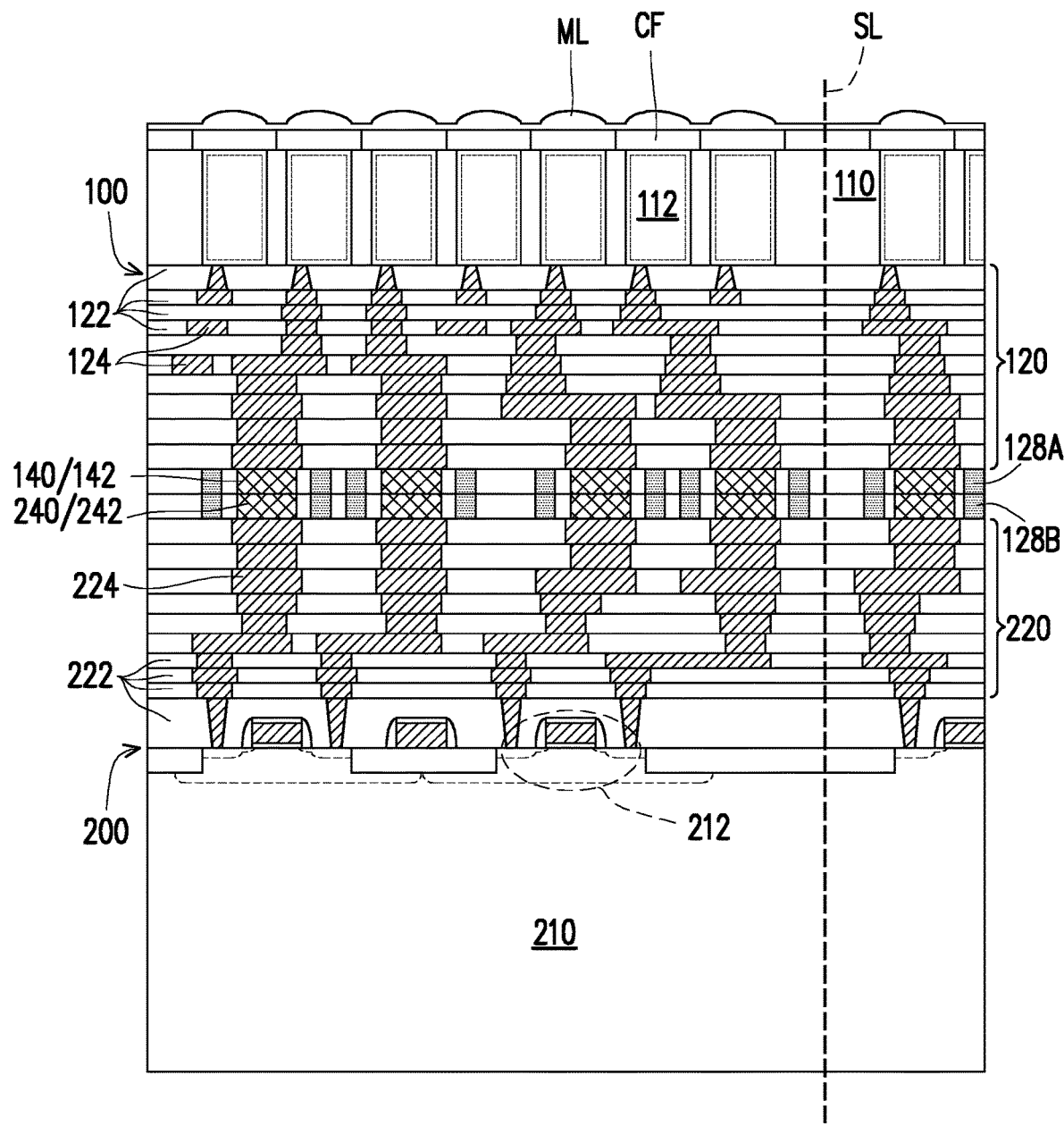
Figure 17:
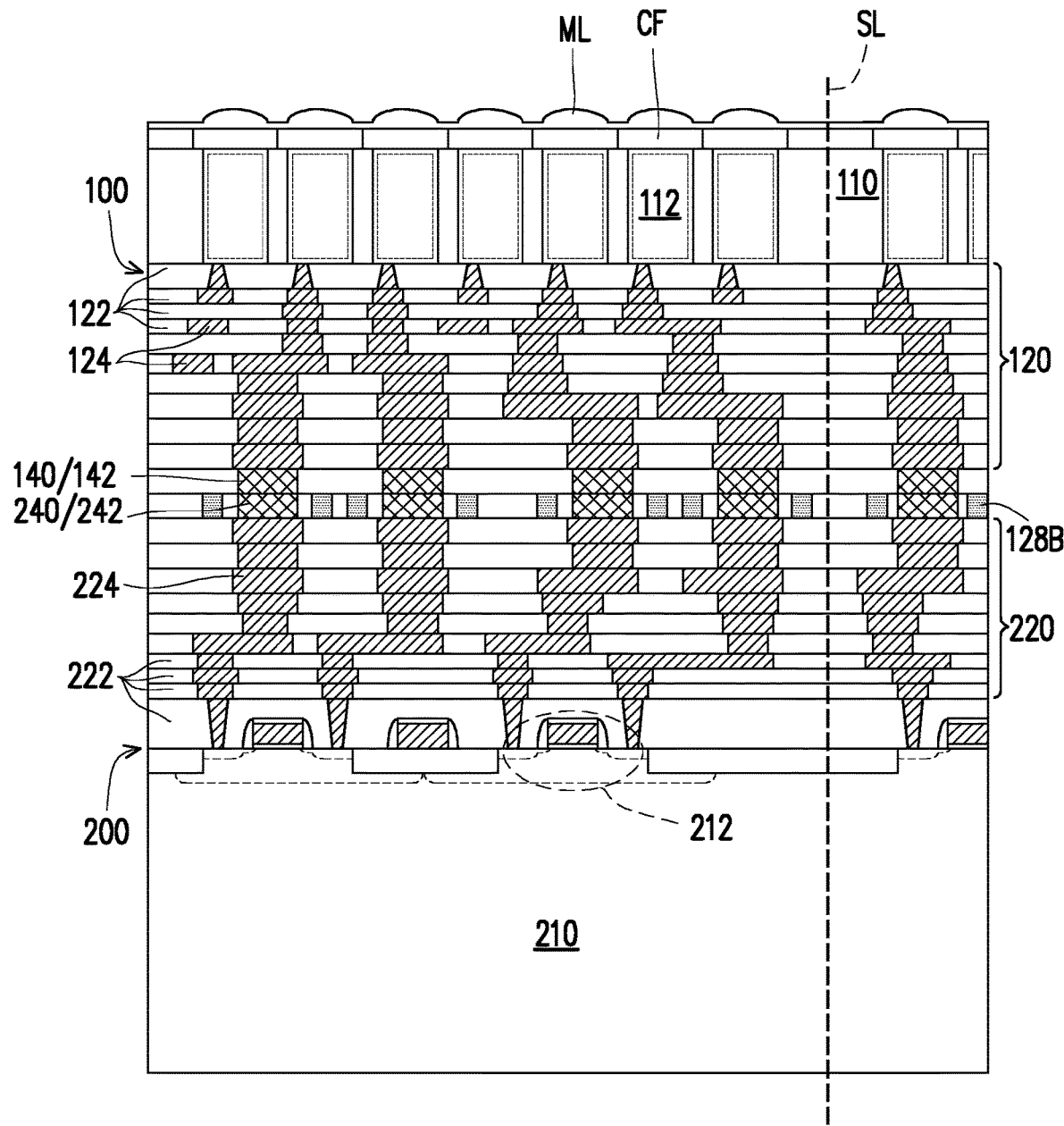
Figure 18:
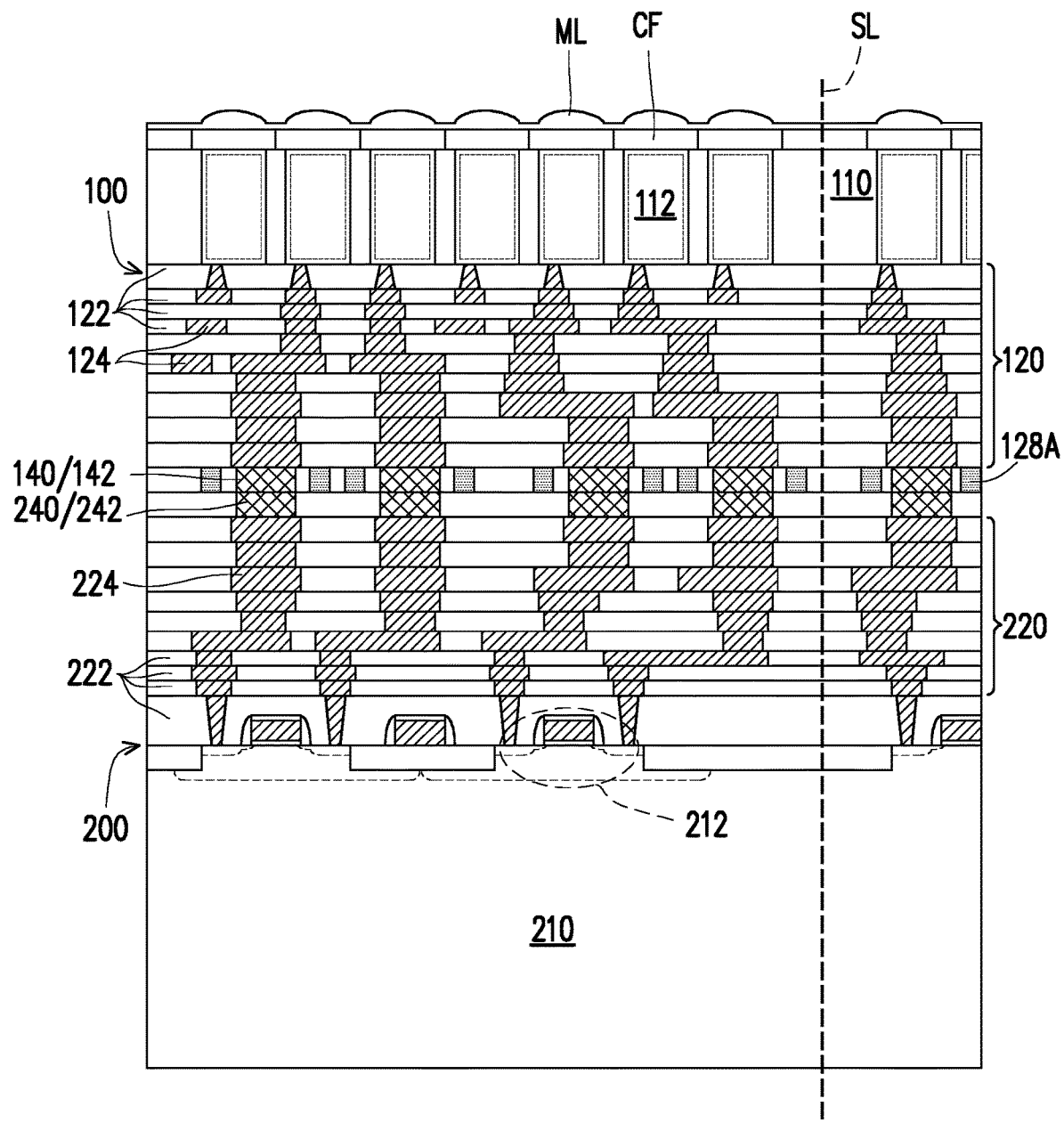
Figure 19:
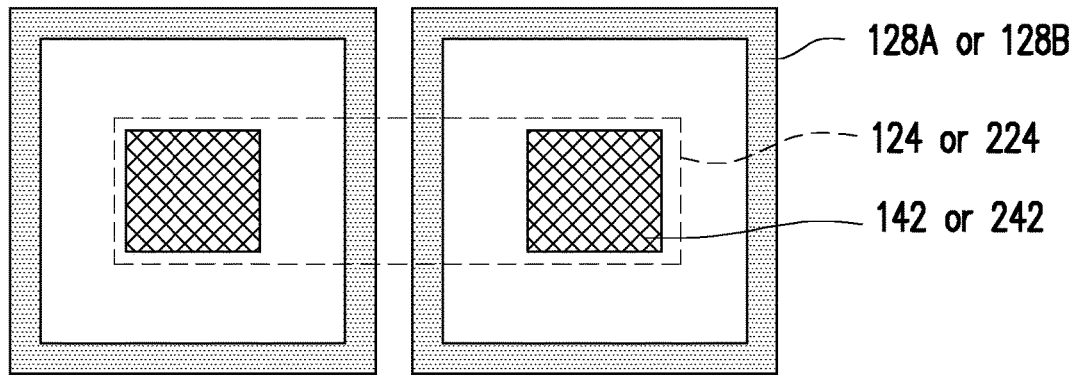
FIGS. 19 through 28 are top views respectively illustrating one conductor group of the first integrated circuit component and/or the second integrated circuit component in accordance with various embodiments of the present disclosure.
Figure 20:
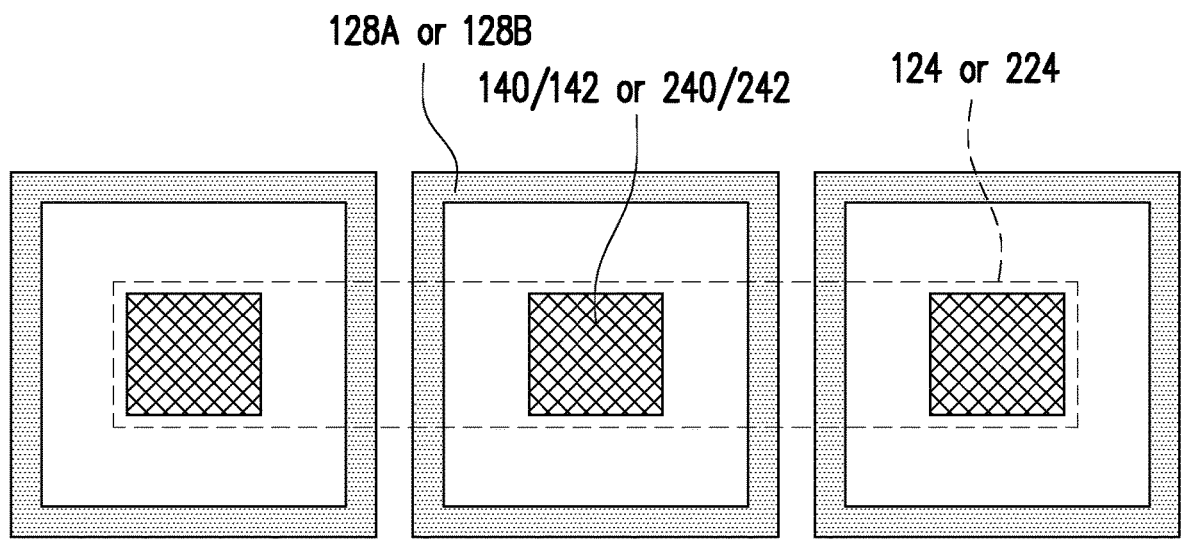
Figure 21:
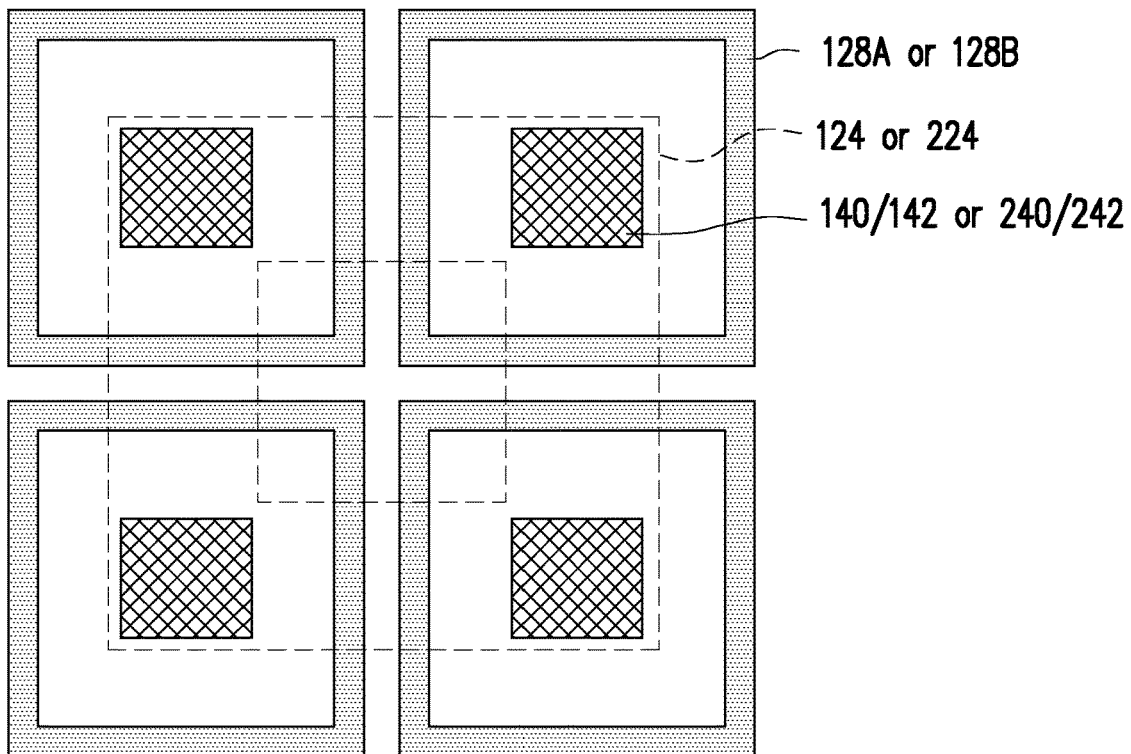
Figure 22:
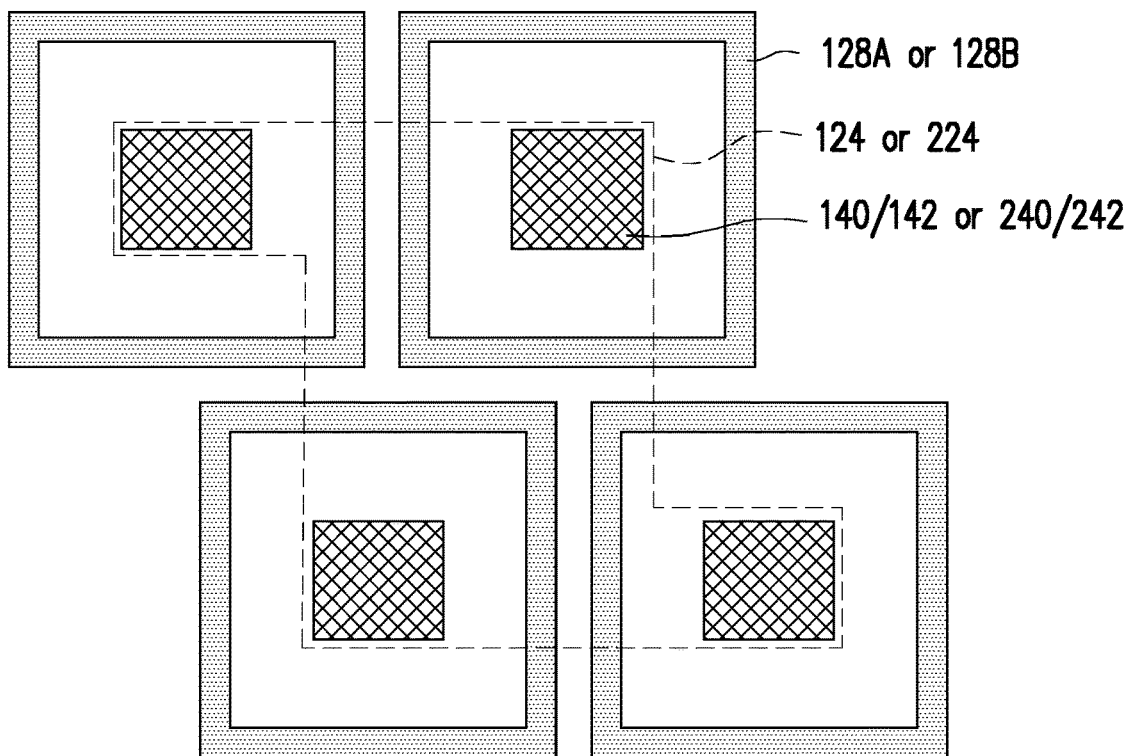

Referring to FIGS. 16 through 18, the first interconnection structure 120 and the second interconnection structure 220 illustrated in FIGS. 16, 17 and 18 are similar with those illustrated in FIGS. 13, 14 and 15 except that the first shunt traces ST1 and the second shunt traces ST2 are absent in the first interconnection structure 120 and the second interconnection structure 220. In other words, the shunt traces design is not necessary to be combined with the isolation structures.

FIGS. 19 through 28 are top views respectively illustrating one conductor group of the first integrated circuit component and/or the second integrated circuit component in accordance with various embodiments of the present disclosure.

Referring to FIGS. 19 through 22, in one conductor group 140/240, a plurality of (e.g., two, three or four first) conductors 142/242 electrically connected each other by one interconnection metal layer 124/224 may be included. Each one of the first conductors 142/242 may be surrounded by one isolation portion 128A and/or 128B. In this embodiment, the isolation portions 128A or 128B may be rectangular rings. The conductors 142/242 belonging to one conductor group 140/240 may arranged along the row direction, the column direction or arranged in array.

Figure 23:
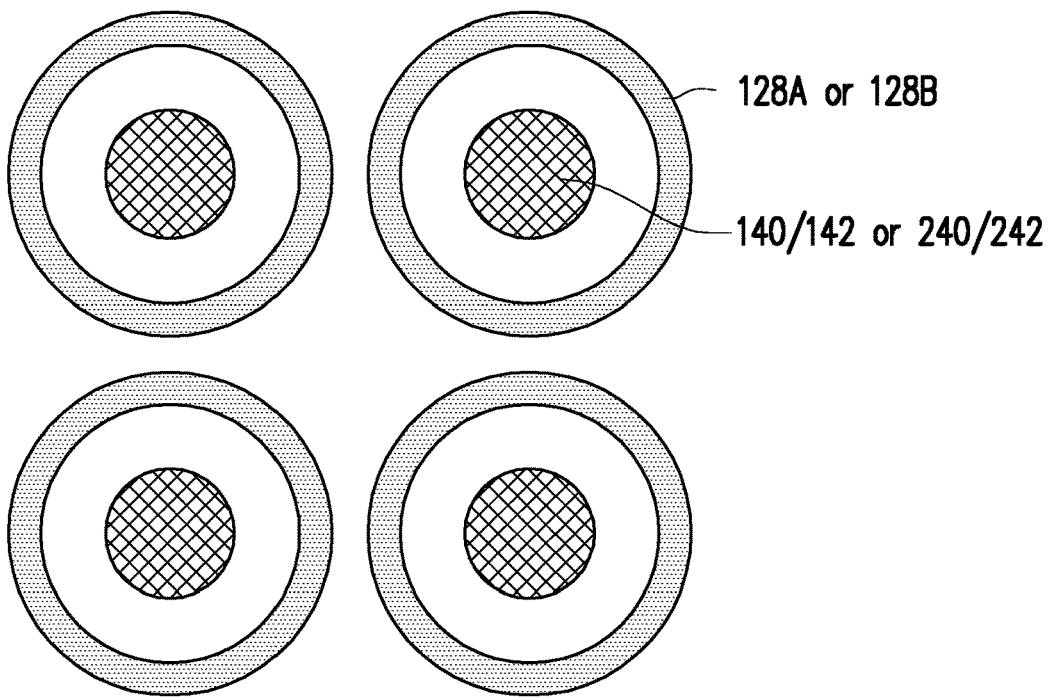
Figure 24:
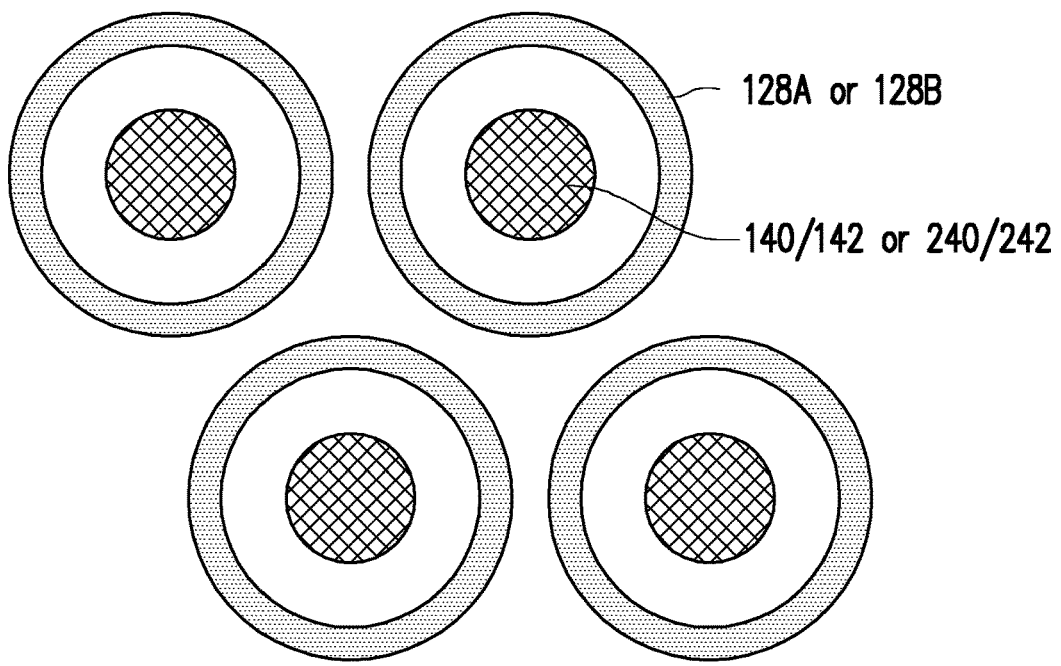
Figure 25:
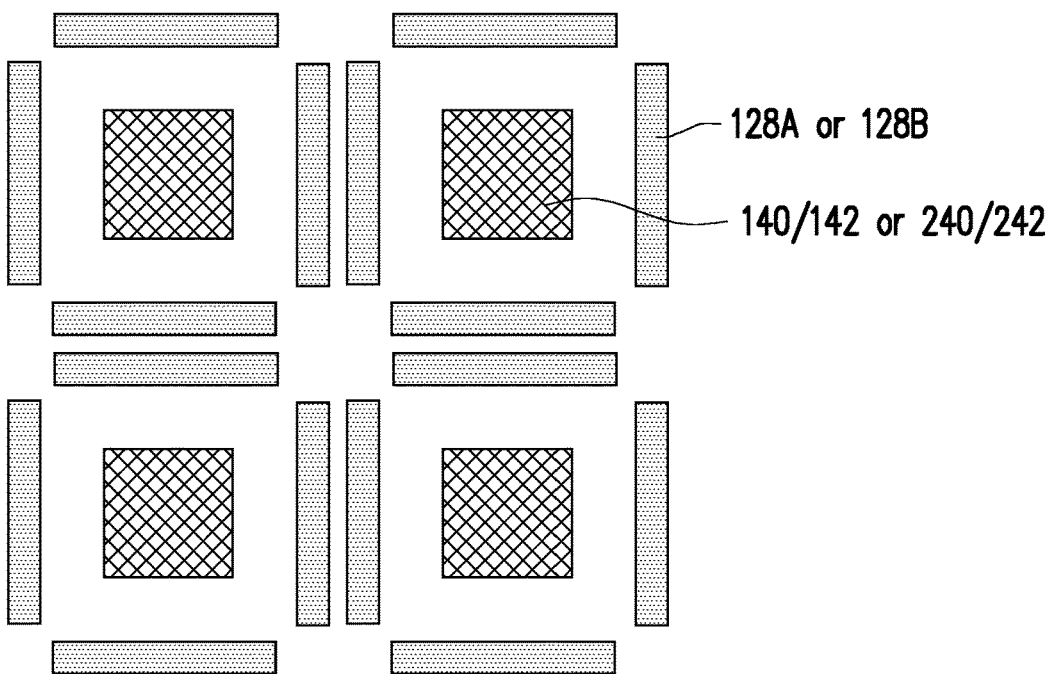
Figure 26:
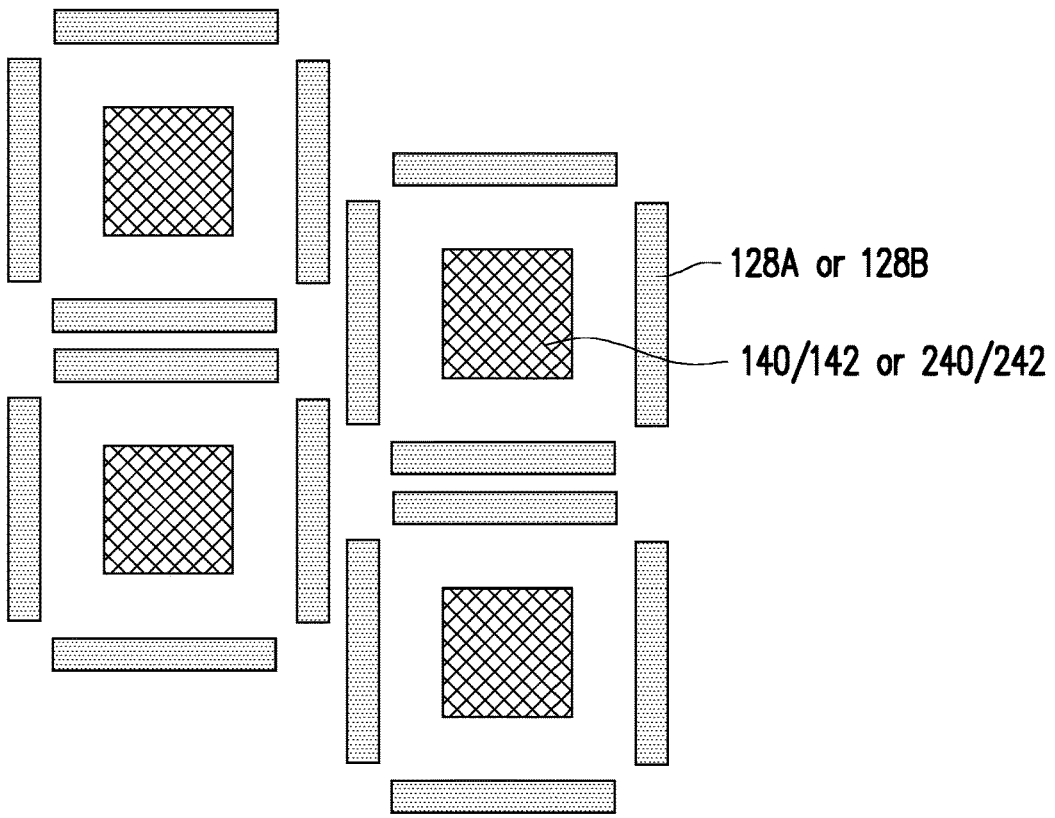
Figure 27:
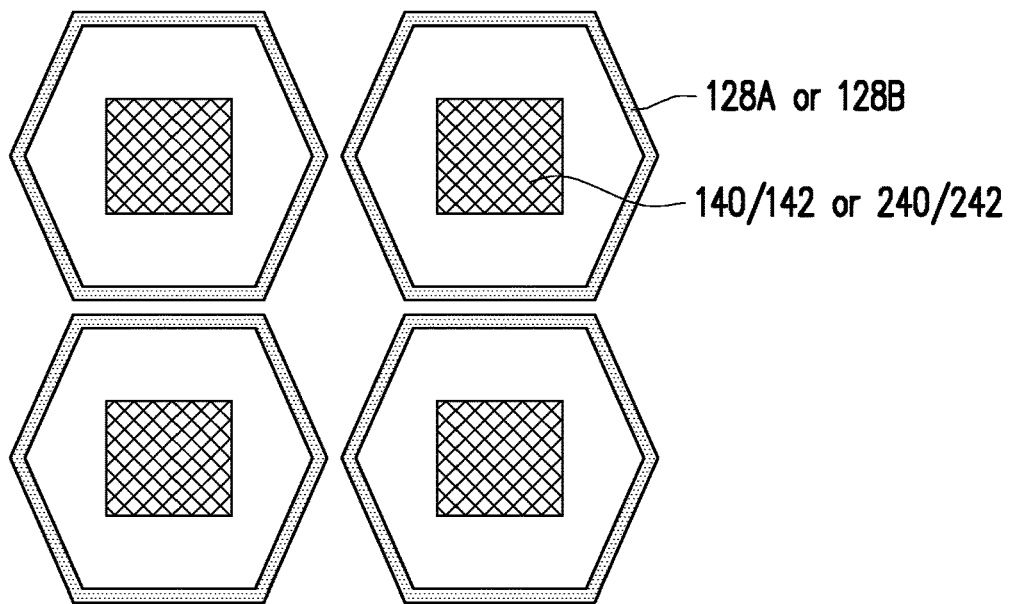
Figure 28:
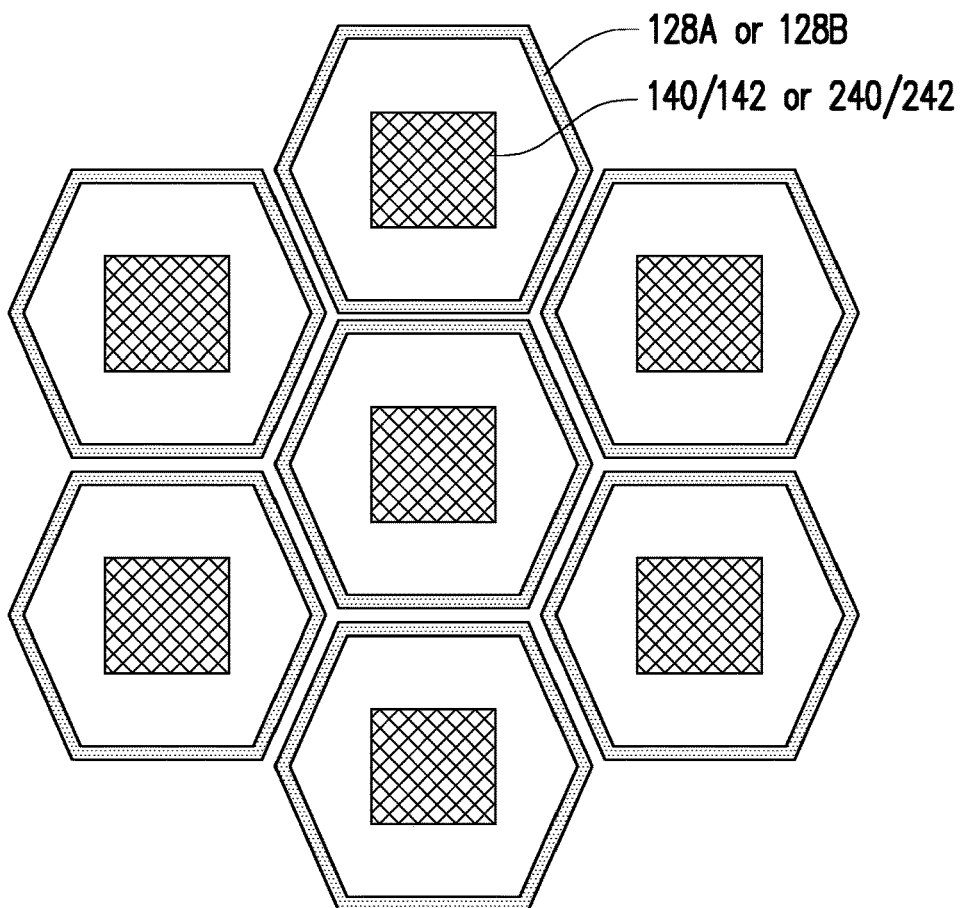

In some alternative embodiments, as shown in FIGS. 23 and 24, the conductors 142/242 electrically connected each other by one interconnection metal layer 124/224 may be of circular shape and the isolation portions 128A or 128B may be circular rings, for example. In some alternative embodiments, as shown in FIGS. 25 and 26, the conductors 142/242 electrically connected each other by one interconnection metal layer 124/224 may be of rectangular shape and the isolation portions 128A or 128B may include a plurality of separated isolation stripes arranged to surround the conductors 142/242, for example. In some other embodiments, as shown in FIGS. 27 and 28, the conductors 142/242 electrically connected each other by one interconnection metal layer 124/224 may be of rectangular shape and the isolation portions 128A or 128B may be of hexagonal shape, for example.

In accordance with some embodiments of the disclosure, a method of fabricating a hybrid bonded structure including the following steps is provided. A first integrated circuit component and a second integrated circuit component are provided. The first integrated circuit component includes a first semiconductor substrate having a plurality of first semiconductor devices therein, a first interconnection structure disposed on the first semiconductor substrate, a first dielectric layer covering the first interconnection structure and at least one first conductor group. The at least one first conductor group includes a plurality of first conductors electrically connected to one another through the first interconnection structure. The second integrated circuit component includes a second semiconductor substrate having a plurality of second semiconductor devices therein, a second interconnection structure disposed on the second semiconductor substrate, a second dielectric layer covering the second interconnection structure and at least one second conductor group. The at least one second conductor group includes a plurality of second conductors electrically connected to one another through the second interconnection structure. A hybrid bonding process is performed to bond the first integrated circuit component and the second integrated component such that the first dielectric layer is bonded to the second dielectric layer and the plurality of first conductors are bonded to the plurality of second conductors.

In accordance with some embodiments of the disclosure, a method of fabricating a hybrid bonded structure including the following steps is provided. A first integrated circuit component and a second integrated circuit component are provided. The first integrated circuit component includes a first semiconductor substrate, a first interconnection structure, a first dielectric layer and a plurality of first conductor groups. The first semiconductor substrate includes a plurality of first semiconductor devices therein. The first interconnection structure is disposed on the first substrate and electrically connected to the first semiconductor devices. The first dielectric layer covers the first interconnection structure. The plurality of first conductor groups are embedded in the first dielectric layer and electrically connected to the first semiconductor devices through the first interconnection structure. At least one first conductor group among the plurality of first conductor groups includes a plurality of first conductors electrically connected to one another. The second integrated circuit component includes a second semiconductor substrate, a second interconnection structure, a second dielectric layer and a plurality of second conductor groups. The second semiconductor substrate includes a plurality of second semiconductor devices therein. The second interconnection structure is disposed on the second substrate and electrically connected to the second semiconductor devices. The second dielectric layer covers the second interconnection structure. The plurality of second conductor groups are embedded in the second dielectric layer and electrically connected to the second semiconductor devices through the second interconnection structure. At least one second conductor group among the plurality of second conductor groups includes a plurality of second conductors electrically connected to one another. A hybrid bonding process is performed to bond the first integrated circuit component and the second integrated component such that the first dielectric layer is bonded to the second dielectric layer and the at least one first conductor group is electrically connected to the at least one second conductor group, wherein a shunt path is provided by the at least one first conductor group, the at least one second conductor group, the first interconnection structure and the second interconnection structure.

In accordance with some embodiments of the disclosure, a hybrid bonded structure including a first integrated circuit chip and a second integrated circuit chip is provided. The first integrated circuit chip includes a first dielectric layer, a plurality of first conductors and a plurality of isolation structures. The plurality of first conductors and the plurality of isolation structures are embedded in the first dielectric layer. The plurality of isolation structures are electrically insulated from the plurality of first conductors and surround the plurality of first conductors. The second integrated circuit chip includes a second dielectric layer and a plurality of second conductors. The plurality of second conductors are embedded in the second dielectric layer. The first dielectric layer is bonded to the second dielectric layer and the plurality of first conductors are bonded to the plurality of second conductors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a hybrid bonded structure, comprising:
   providing a first integrated circuit component comprising a first semiconductor substrate having a plurality of first semiconductor devices therein, a first interconnection structure disposed on the first semiconductor substrate, a first dielectric layer covering the first interconnection structure and at least one first conductor group, the at least one first conductor group comprising a plurality of first conductors exposed from the first dielectric layer, and the plurality of first conductors of the at least one first conductor group being electrically connected to one another through the first interconnection structure;

providing a second integrated circuit component comprising a second semiconductor substrate having a plurality of second semiconductor devices therein, a second interconnection structure disposed on the second semiconductor substrate, a second dielectric layer covering the second interconnection structure and at least one second conductor group, the at least one second conductor group comprising a plurality of second conductors exposed from the second dielectric layer, and the plurality of second conductors of the at least one second conductor group being electrically connected to one another through the second interconnection structure; and performing a hybrid bonding process to bond the first integrated circuit component and the second integrated component such that the first dielectric layer is bonded to the second dielectric layer and the plurality of first conductors are bonded to the plurality of second conductors.

2. The method as claimed in claim 1, wherein the hybrid bonding process comprises:
performing a treatment for dielectric bonding between the first dielectric layer and the second dielectric layer; and
performing a thermal annealing for conductor bonding between the plurality of first conductors and the plurality of second conductors.

3. The method as claimed in claim 1, wherein a process temperature of the thermal annealing for conductor bonding is higher than that of the treatment for dielectric bonding.

4. The method as claimed in claim 1, wherein the treatment for dielectric bonding the first dielectric layer and the second dielectric layer is performed at temperature ranging from about 100 Celsius degree to about 150 Celsius degree.

5. The method as claimed in claim 1, wherein the thermal annealing for conductor bonding is performed at temperature ranging from about 300 Celsius degree to about 400 Celsius degree.

6. The method as claimed in claim 1, wherein the conductor bonding between the plurality of first conductors and the plurality of second conductors comprises a via-to-via bonding, a pad-to-pad bonding or a via-to-pad bonding.

7. The method as claimed in claim 1 further comprising:
singulating the first integrated circuit component and the second integrated component hybrid bonded to each other to form a plurality of singulated hybrid bonded structures.

8. A method of fabricating a hybrid bonded structure, comprising:
providing a first integrated circuit component comprising a first semiconductor substrate, a first interconnection structure, a first dielectric layer and a plurality of first conductor groups, the first semiconductor substrate comprising a plurality of first semiconductor devices therein, the first interconnection structure being disposed on the first substrate and electrically connected to the first semiconductor devices, the first dielectric layer covering the first interconnection structure, the plurality of first conductor groups being embedded in the first dielectric layer and electrically connected to the first semiconductor devices through the first interconnection structure, and at least one first conductor group among the plurality of first conductor groups comprising a plurality of first conductors exposed from the first dielectric layer, and the plurality of first conductors of the at least one first conductor group being electrically connected to one another;

a second integrated circuit component comprising a second semiconductor substrate, a second interconnection structure, a second dielectric layer and a plurality of second conductor groups, the second semiconductor substrate comprising a plurality of second semiconductor devices therein, the second interconnection structure being disposed on the second substrate and electrically connected to the second semiconductor devices, the second dielectric layer covering the second interconnection structure, the plurality of second conductor groups being embedded in the second dielectric layer and electrically connected to the second semiconductor devices through the second interconnection structure, and at least one second conductor group among the plurality of second conductor groups comprising a plurality of second conductors exposed from the second dielectric layer, and the plurality of second conductors of the at least one second conductor group being electrically connected to one another, performing a hybrid bonding process to bond the first integrated circuit component and the second integrated component such that the first dielectric layer is bonded to the second dielectric layer and the at least one first conductor group is electrically connected to the at least one second conductor group, wherein a shunt path is provided by the at least one first conductor group, the at least one second conductor group, the first interconnection structure and the second interconnection structure.

9. The method as claimed in claim 8, wherein the hybrid bonding process comprises:
performing a treatment for dielectric bonding between the first dielectric layer and the second dielectric layer; and
performing a thermal annealing for conductor bonding between the plurality of first conductors and the plurality of second conductors.

10. The method as claimed in claim 9, wherein a process temperature of the thermal annealing for conductor bonding is higher than that of the treatment for dielectric bonding.

11. The method as claimed in claim 9, wherein the treatment for dielectric bonding the first dielectric layer and the second dielectric layer is performed at temperature ranging from about 100 Celsius degree to about 150 Celsius degree.

12. The method as claimed in claim 9, wherein the thermal annealing for conductor bonding is performed at temperature ranging from about 300 Celsius degree to about 400 Celsius degree.

13. The method as claimed in claim 9, wherein the conductor bonding between the plurality of first conductors and the plurality of second conductors comprises a via-to-via bonding, a pad-to-pad bonding or a via-to-pad bonding.

14. The method as claimed in claim 8 further comprising:
singulating the first integrated circuit component and the second integrated component hybrid bonded to each other to form a plurality of singulated hybrid bonded structures.

15. A method, comprising:
providing a first integrated circuit component having a first bonding layer, the first bonding layer comprising a first dielectric layer and at least one first conductor group penetrating through the first dielectric layer, the at least one first conductor group comprising a plurality of first conductors exposed from the first dielectric layer, and the plurality of first conductors of the at least one first conductor group being electrically connected to one another through a first shunt trace in the first integrated circuit component;

providing a second integrated circuit component having a second bonding layer, the second bonding layer comprising a second dielectric layer and at least one second conductor group penetrating through the second dielectric layer, and the at least one second conductor group comprising a plurality of second conductors exposed from the second dielectric layer; and bonding the first bonding layer to the second bonding layer such that the first dielectric layer is bonded to the second dielectric layer and the plurality of first conductors are bonded to the plurality of second conductors.

16. The method as claimed in claim 15, wherein the first bonding layer further comprises at least one first isolation portion penetrating through the first dielectric layer and electrically insulated from the plurality of first conductors, and at least one of the plurality of first conductors is surrounded by the at least one first isolation portion.

17. The method as claimed in claim 16, wherein the plurality of first isolation portions are bonded to second dielectric layer after bonding the first bonding layer to the second bonding layer.

18. The method as claimed in claim 16, wherein second bonding layer further comprises at least one second isolation portion penetrating through the second dielectric layer and electrically insulated from the plurality of second conductors, and at least one of the plurality of second conductors is surrounded by the at least one second isolation portion.

19. The method as claimed in claim 18, wherein the plurality of first isolation portions are bonded to the plurality of second isolation portions after bonding the first bonding layer to the second bonding layer.

20. The method as claimed in claim 15, wherein the plurality of second conductors of the at least one second conductor group are electrically connected to one another through a second shunt trace in the second integrated circuit component.

* * * * *